US011588085B2

(12) United States Patent
Ban et al.

(10) Patent No.: US 11,588,085 B2
(45) Date of Patent: Feb. 21, 2023

(54) LIGHT EMITTING DRIVE SUBSTRATE AND MANUFACTURING METHOD THEREOF, LIGHT EMITTING SUBSTRATE AND DISPLAY DEVICE

(71) Applicant: BOE TECHNOLOGY GROUP CO., LTD., Beijing (CN)

(72) Inventors: Shengguang Ban, Beijing (CN); Zhanfeng Cao, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 266 days.

(21) Appl. No.: 16/766,197

(22) PCT Filed: May 10, 2019

(86) PCT No.: PCT/CN2019/086452
§ 371 (c)(1),
(2) Date: May 21, 2020

(87) PCT Pub. No.: WO2020/227861
PCT Pub. Date: Nov. 19, 2020

(65) Prior Publication Data
US 2022/0005989 A1    Jan. 6, 2022

(51) Int. Cl.
*H01L 33/62* (2010.01)
*H01L 33/12* (2010.01)
*H01L 33/40* (2010.01)

(52) U.S. Cl.
CPC .............. *H01L 33/62* (2013.01); *H01L 33/12* (2013.01); *H01L 33/405* (2013.01); *H01L 2933/0016* (2013.01); *H01L 2933/0066* (2013.01)

(58) Field of Classification Search
CPC ....... H01L 33/62; H01L 33/12; H01L 33/405; H01L 25/0753; H01L 25/167; G02F 1/133612
See application file for complete search history.

(56) References Cited

U.S. PATENT DOCUMENTS 9,793,335 B2    10/2017    Yamazaki et al.
11,004,382 B2    5/2021    Li et al.
(Continued)

FOREIGN PATENT DOCUMENTS

CN    1360350 A    7/2002
CN    1988744 A    6/2007
(Continued)

OTHER PUBLICATIONS

International Search Report of PCT/CN2019/086452 in Chinese, dated Feb. 7, 2020.
(Continued)

*Primary Examiner* — Latanya N Crawford Eason
(74) *Attorney, Agent, or Firm* — Collard & Roe, P.C.

(57) ABSTRACT

A light emitting drive substrate, a manufacturing method of the light emitting drive substrate, a light emitting substrate and a display device. The light emitting drive substrate includes a first light-emitting subregion, a second light-emitting subregion, a periphery area, a first power supply wire and a second power supply wire. A resistance between the first end and the second end of the first power supply wire is equal to a resistance between the first end and the second end of the second power supply wire, and a wire length between the first end and the second end of the first power supply wire is not equal to a wire length between the first end and the second end of the second power supply wire.

18 Claims, 11 Drawing Sheets

(56) References Cited

U.S. PATENT DOCUMENTS

| | | | |
|---|---|---|---|
| 11,093,072 B2* | 8/2021 | Hu | .................. G06F 3/04164 |
| 2002/0079503 A1 | 6/2002 | Yamazaki et al. | |
| 2007/0159081 A1 | 7/2007 | Bae | |

FOREIGN PATENT DOCUMENTS

| | | |
|---|---|---|
| CN | 101865380 A | 10/2010 |
| CN | 106531768 A | 3/2017 |
| CN | 107870494 A | 4/2018 |
| CN | 108389880 A | 8/2018 |
| CN | 109116626 A | 1/2019 |
| CN | 109585618 A | 4/2019 |
| JP | H10339880 A | 12/1998 |

OTHER PUBLICATIONS

Notice of Transmittal of the International Search Report of PCT/CN2019/086452 in Chinese, dated Feb. 7, 2020.
Written Opinion of the International Searching Authority of PCT/CN2019/086452 in Chinese, dated Feb. 7, 2020.
Chinese Office Action in Chinese Application No. 201980000617.4 dated Dec. 10, 2021 with English translation.
International Search Report of PCT/CN2019/086452 in Chinese, dated Feb. 7, 2020 with English translation.

\* cited by examiner

LIGHT EMITTING DRIVE SUBSTRATE AND MANUFACTURING METHOD THEREOF, LIGHT EMITTING SUBSTRATE AND DISPLAY DEVICE

CROSS REFERENCE TO RELATED APPLICATIONS

This application is the National Stage of PCT/CN2019/086452 filed on May 10, 2019, the disclosure of which is incorporated by reference.

TECHNICAL FIELD

Embodiments of the present disclosure relate to a light emitting drive substrate and a manufacturing method thereof, a light emitting substrate and a display device.

BACKGROUND

With the continuous development of display technology, users have higher and higher requirements for the contrast ratio, brightness uniformity and screen-to-body ratio of the display device.

The liquid crystal display device includes a backlight module and a liquid crystal panel. The backlight module is arranged on the non-display side of the liquid crystal panel to provide a light source for the display operation of the display panel. The liquid crystal panel comprises a polarizer, an array substrate, an opposite substrate and a liquid crystal molecular layer filled between the above two substrates. The liquid crystal display device allows the liquid crystal molecules in the liquid crystal molecular layer to be rotated by forming an electric field between the array substrate and the opposite substrate, and the rotated liquid crystal molecules can cooperate with the polarizer to form a liquid crystal light valve. Because the liquid crystal molecular layer itself does not emit light, the liquid crystal display device needs to use backlight module to realize the display function. The contrast ratio, brightness uniformity and screen-to-body ratio of the liquid crystal display device are related to the structure and performance of backlight module.

SUMMARY

At least one embodiment of the present disclosure provides a light emitting drive substrate, which comprises a first light-emitting subregion, a second light-emitting subregion, a periphery area, a first power supply wire and a second power supply wire. The first light-emitting subregion comprises a first common electrode, and the second light-emitting subregion comprises a second common electrode; the first power supply wire comprises a first end which is electrically connected with the first common electrode and a second end which is extended to the periphery area and is configured for electrically connection so as to receive a first power supply voltage; the second power supply wire comprises a first end which is electrically connected with the second common electrode and a second end which is extended to the periphery area and is configured for electrically connection so as to receive the first power supply voltage; a resistance between the first end of the first power supply wire and the second end of the first power supply wire is equal to a resistance between the first end of the second power supply wire and the second end of the second power supply wire; and a wire length between the first end of the first power supply wire and the second end of the first power supply wire is not equal to a wire length between the first end of the second power supply wire and the second end of the second power supply wire.

For example, in at least one example of the light emitting drive substrate, a ratio of the wire length between the first end of the first power supply wire and the second end of the first power supply wire to the wire length between the first end of the second power supply wire and the second end of the second power supply wire, is equal to a ratio of a wire width of the first power supply wire to a wire width of the second power supply wire.

For example, in at least one example of the light emitting drive substrate, the light emitting drive substrate further comprises a third light-emitting subregion and a third power supply wire. The third light-emitting subregion comprises a third common electrode; the third power supply wire comprises a first end which is electrically connected with the third common electrode and a second end which is extended to the periphery area and is configured for electrically connection so as to receive the first power supply voltage; a resistance between the first end of the third power supply wire and the second end of the third power supply wire is equal to the resistance between the first end of the first power supply wire and the second end of the first power supply wire; and the wire length between the first end of the first power supply wire and the second end of the first power supply wire, the wire length between the first end of the second power supply wire and the second end of the second power supply wire and a wire length between the first end of the third power supply wire and the second end of the third power supply wire are different from each other.

For example, in at least one example of the light emitting drive substrate, the wire width of the first power supply wire, the wire width of the second power supply wire and a wire width of the third power supply wire decrease gradually.

For example, in at least one example of the light emitting drive substrate, the wire width of the first power supply wire, the wire width of the second power supply wire and the wire width of the third power supply wire decrease according to an arithmetic progression.

For example, in at least one example of the light emitting drive substrate, the light emitting drive substrate further comprises a first opposite power supply wire and a second opposite power supply wire. The first light-emitting subregion further comprises a first opposite common electrode, the second light-emitting subregion further comprises a second opposite common electrode; the first opposite power supply wire comprises a first end which is electrically connected with the first opposite common electrode a second end which is extended to the periphery area and is configured for electrically connection so as to receive a second power supply voltage; the second opposite power supply wire comprises a first end which is electrically connected with the second opposite common electrode and a second end which is extended to the periphery area and is configured for electrically connection so as to receive the second power supply voltage; a resistance between the first end of the first opposite power supply wire and the second end of the first opposite power supply wire is equal to a resistance between the first end of the second opposite power supply wire and the second end of the second opposite power supply wire; a wire length between the first end of the first opposite power supply wire and the second end of the first opposite power supply wire is not equal to a wire length between the first end of the second opposite power supply wire and the second end of the second opposite power supply wire; and the second power supply voltage is smaller than the first power supply voltage.

For example, in at least one example of the light emitting drive substrate, the first light-emitting subregion comprises a plurality of first electrical contact sections and a plurality of first opposite electrical contact sections; t least part of the plurality of first electrical contact sections is connected with the first common electrode; t least part of the plurality of first opposite electrical contact sections is connected with the first opposite common electrode; the second light-emitting subregion comprises a plurality of second electrical contact sections and a plurality of second opposite electrical contact sections; at least part of the plurality of second electrical contact sections is connected with the second common electrode; and at least part of the plurality of second opposite electrical contact sections is connected with the second opposite common electrode.

For example, in at least one example of the light emitting drive substrate, the plurality of first electrical contact sections, the plurality of first opposite electrical contact sections, the plurality of second electrical contact sections, the plurality of second opposite electrical contact sections, the first common electrode, the first opposite common electrode, the second common electrode and the second opposite common electrode are in same one layer.

For example, in at least one example of the light emitting drive substrate, the first light-emitting subregion and the second light-emitting subregion are arranged in parallel in a first direction; and the first power supply wire, the second power supply wire, the first opposite power supply wire and the second opposite power supply wire are arranged in parallel in a second direction which intersects the first direction.

For example, in at least one example of the light emitting drive substrate, the first light-emitting subregion comprises one first electrical contact section and one first opposite electrical contact section; the one first electrical contact section is connected with the first common electrode, and the one first opposite electrical contact section is connected with the first opposite common electrode; and the second light-emitting subregion comprises one second electrical contact section and one second opposite electrical contact section, the one second electrical contact section is connected with the second common electrode, and the one second opposite electrical contact section is connected with the second opposite common electrode.

For example, in at least one example of the light emitting drive substrate, the light emitting drive substrate further comprises a base substrate, a first insulation layer, a first electrode layer and a second electrode layer. The first electrode layer is at a side of the second electrode layer away from the base substrate; the first electrode layer comprises the first common electrode, the second common electrode, the first opposite common electrode and the second opposite common electrode; the second electrode layer comprises the first power supply wire, the second power supply wire, the first opposite power supply wire and the second opposite power supply wire; the first insulation layer is between the first electrode layer and the second electrode layer, and comprises a first through hole, a second through hole, a third through hole and a fourth through hole; and the first power supply wire is electrically connected with the first common electrode via the first through hole, the second power supply wire is electrically connected with the second common electrode via the second through hole, the first opposite power supply wire is connected with the first opposite common electrode via the third through hole electrically, and the second opposite power supply wire is electrically connected with the second opposite common electrode via the fourth through hole.

For example, in at least one example of the light emitting drive substrate, the first electrode layer is formed by a first conductive layer, and the first conductive layer comprises a first metal layer; and the first conductive layer further comprises a first transparent conductive oxide which is stacked with the first metal layer, and the first transparent conductive oxide is at a side of the first metal layer away from the second electrode layer.

For example, in at least one example of the light emitting drive substrate, the second electrode layer is formed by a second conductive layer; the second conductive layer comprises a second metal layer; and a thickness of the second metal layer is larger than a thickness of the first metal layer.

For example, in at least one example of the light emitting drive substrate, the second conductive layer further comprises a first auxiliary electrode layer which is at a side of the second metal layer closer to the first electrode layer and a second auxiliary electrode layer which is at a side of the second metal layer away from the first electrode layer.

For example, in at least one example of the light emitting drive substrate, both of the second metal layer and the first metal layer are formed of a copper-containing metal; and both of the first auxiliary electrode layer and the second auxiliary electrode layer are formed of a molybdenum-niobium alloy.

For example, in at least one example of the light emitting drive substrate, the light emitting drive substrate further comprises a reflective layer and a second insulation layer. The reflective layer is at a side of the first electrode layer away from the second electrode layer; the second insulation layer is between the first electrode layer and the reflective layer; the reflective layer comprises a third insulation layer, a second transparent conductive oxide layer, a third metal layer and a third transparent conductive oxide layer which are sequentially provided; and as compared to the third insulation layer, the third transparent conductive oxide layer is closer to the first electrode layer.

For example, in at least one example of the light emitting drive substrate, the light emitting drive substrate further comprises a stress buffer layer and a protective layer. The stress buffer layer is between the base substrate and the second electrode layer; and the protective layer is between the second electrode layer and the first insulation layer.

At least one embodiment of the present disclosure further provides a light emitting substrate, which comprises a light emitting drive substrate provided by any one of the embodiments of the present disclosure, at least one first light emitting element which is in the first light-emitting subregion, and at least one second light emitting element which is in the second light-emitting subregion. The at least one first light emitting element is configured to receive a first power supply voltage on the first power supply wire so as to emit light, and the at least one second light emitting element is configured to receive the first power supply voltage on the second power supply wire so as to emit light.

At least one embodiment of the present disclosure further provides display device, comprising a light emitting substrate provided by any one of the embodiments of the present disclosure.

At least one embodiment of the present disclosure further provides manufacturing method of a light emitting drive substrate, the light emitting drive substrate comprises a periphery area, and the method comprises: forming a first light-emitting subregion, a second light-emitting subregion, a first power supply wire and a second power supply wire. The first light-emitting subregion comprises a first common electrode, and the second light-emitting subregion comprises a second common electrode; the first power supply wire comprises a first end which is electrically connected with the first common electrode and a second end which is extended to the periphery area and is configured for electrically connection so as to receive a first power supply voltage; the second power supply wire comprises a first end which is electrically connected with the second common electrode and a second end which is extended to the periphery area and is configured for electrically connection so as to receive the first power supply voltage; a resistance between the first end of the first power supply wire and the second end of the first power supply wire is equal to a resistance between the first end of the second power supply wire and the second end of the second power supply wire; and a wire length between the first end of the first power supply wire and the second end of the first power supply wire is not equal to a wire length between the first end of the second power supply wire and the second end of the second power supply wire.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In some backlight modules, the backlight module comprises a plurality of (for example, a few dozen) large size light-emitting diodes (LED) which are arranged in an array, and the above light-emitting diodes cannot be controlled independently, for example, all of light-emitting diodes are simultaneously turned on or simultaneously turned off, such that it is not in favor of improving the contrast ratio of a display device including the backlight module.

Figure 1A:
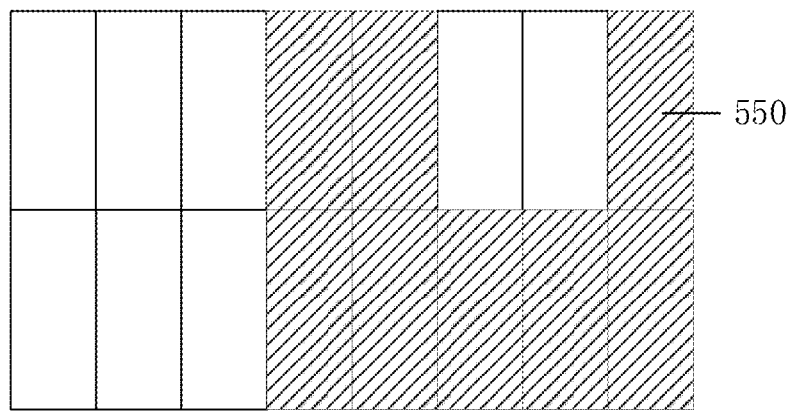
FIG. 1A is a schematic plan view of a backlight module.
Figure 1B:
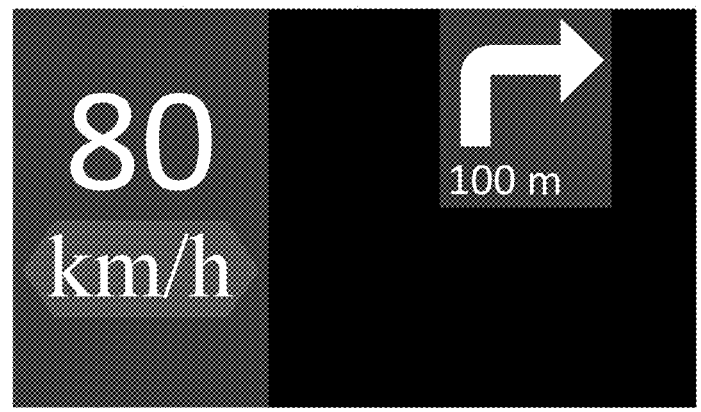
FIG. 1B illustrates an example of an image displayed by a display device including the backlight module as illustrated in FIG. 1A.

The inventors of the present disclosure have noted during research that local control are performed on the backlight module of a liquid crystal display device to increase the contrast ratio of the liquid crystal display device. FIG. 1A illustrates a schematic plan view of a backlight module, FIG. 1B illustrates an example of the image displayed by a display device including the backlight module as illustrated in FIG. 1A. For example, as illustrated in FIG. 1A, the backlight module of the liquid crystal display device can be divided into a plurality of subregions 550 (referring to FIG. 1A); in the display operation, the subregions 550, which are corresponding to a black region (i.e., a region that does not comprise displayed information) of an image to be displayed, of the backlight module are allowed to emit no light, so as to allow the brightness of partially region (the region corresponding to the subregions 550) of the image displayed by the display device to be zero (i.e., absolute black can be realized), such that the contrast ratio of the liquid crystal display device including the backlight module can be increased. For example, through performing of local control on the backlight module, high-dynamic range (HDR) display can be realized.

In some backlight modules, the drive wires of the backlight module are on a printed circuit board (PCB), and LEDs are mounted on the PCB, however, the above technical solution can cause the thickness and the cost of the backlight module to be relatively high.

In some backlight modules, the drive wires of the backlight module may be on a glass substrate, and LEDs may be mounted on the glass substrate. However, the inventors of the present disclosure have noted during research that the above technical solution can cause the structure of the drive circuit of the backlight module to be complicated, cause the screen-to-body ratio of the display device to be relatively low, and cause the brightness homogeneity and the display quality of the display device to be poor. Illustrative descriptions regarding the above issues are given with reference to FIG. 2A and FIG. 2B.

Figure 2A:
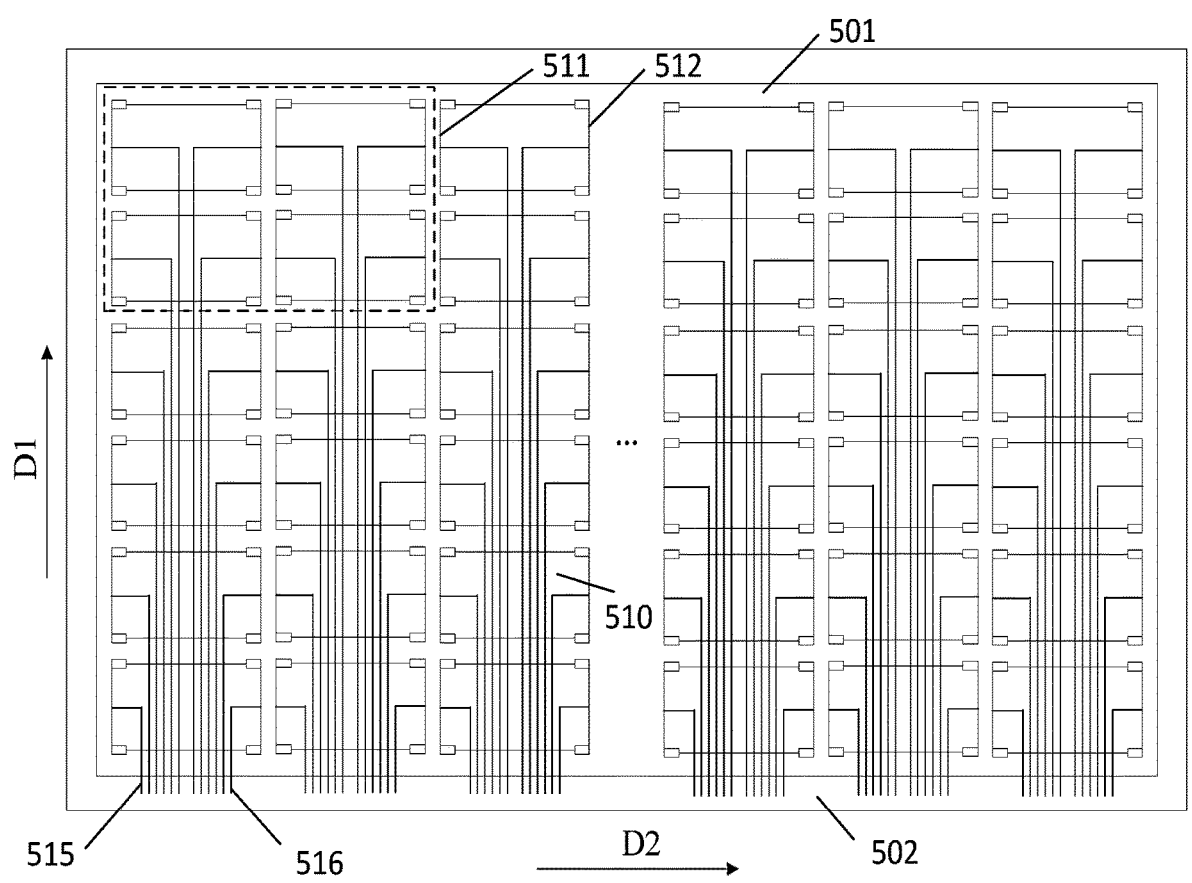
FIG. 2A is a light emitting drive substrate.

FIG. 2A illustrates a light emitting drive substrate, and the light emitting drive substrate can serve as a component of a backlight module, and may be applied in a display device. As illustrated in FIG. 2A, the light emitting drive substrate comprises a light emitting region 501 and a periphery area 502 at the outside of the light emitting region 501. The light emitting region 501 is provided with a plurality of subregions 510 which are arranged in an array, and the plurality of subregions 510 are arranged in a plurality of rows along the first direction D1 and arranged in a plurality of columns along the second direction D2.

As illustrated in FIG. 2A, each subregion 510 comprises a common electrode 511 (for example, a wire for parallel connection of anodes) and an opposite common electrode 512 (for example, a wire for parallel connection of cathodes). Each subregion 510 is corresponding to one power supply wire 515 (for example, one anode power supply wire) and one opposite power supply wire 516 (for example, one cathode power supply wire). The power supply wire 515 comprises a first end which is electrically connected with the common electrode 511 and a second end which is extended to the periphery area 502 and is configured for electrically connection so as to receive a first power supply voltage; the opposite power supply wire 516 comprises a first end which is electrically connected with the opposite common electrode 512 and a second end which is extended to the periphery area 502 and is configured for electrically connection so as to receive a second power supply voltage. For example, the second ends of all of the power supply wires 515 of the light emitting drive substrate and the second ends of all of the opposite power supply wires 516 of the light emitting drive substrate may be at same one side of the light emitting region 501 (for example, the lower side of the light emitting region 501 in FIG. 2A).

Figure 2B:
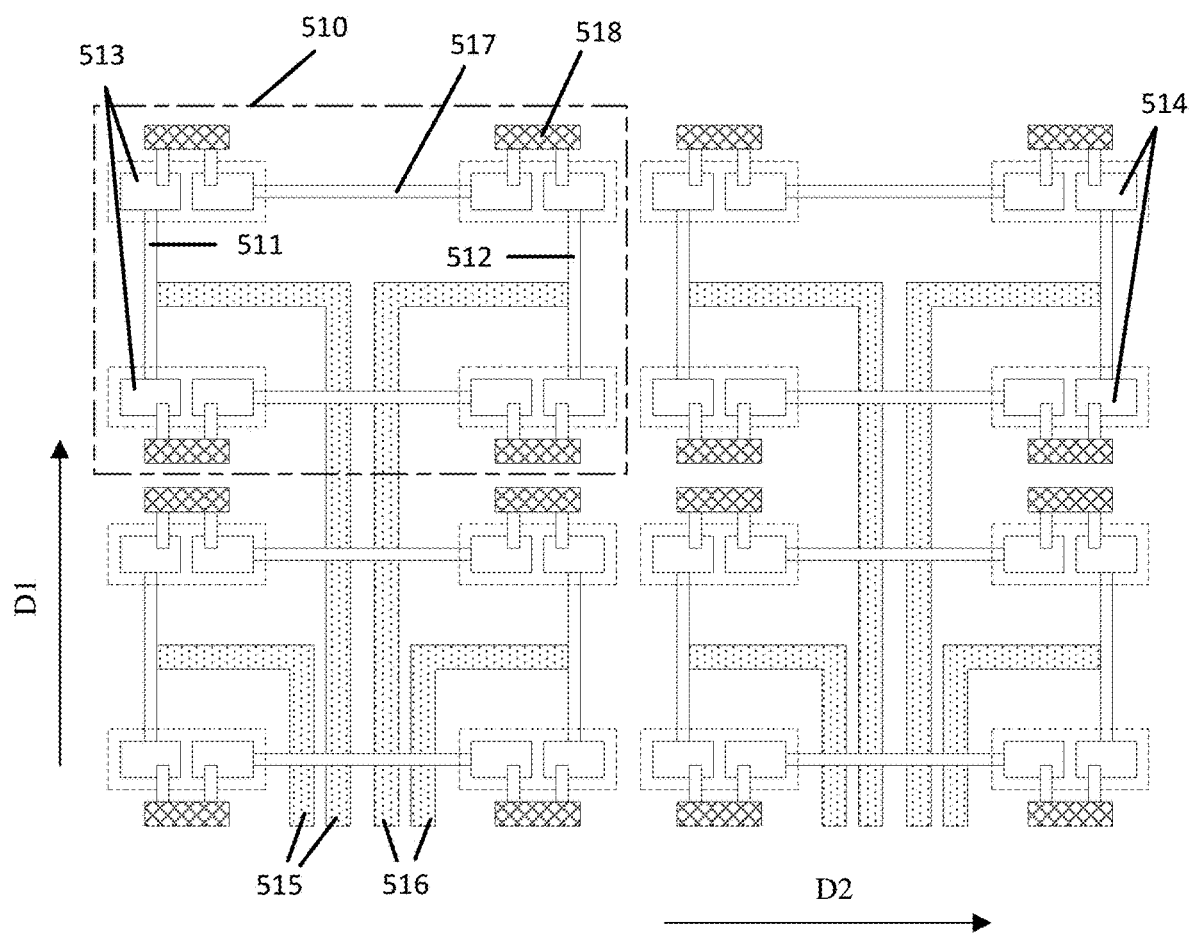
FIG. 2B is an enlarged diagram of a partially region of the light emitting drive substrate as illustrated in FIG. 2A.

FIG. 2B is an enlarged diagram of a partially region (the region in the dashed box) of the light emitting drive substrate as illustrated in FIG. 2A; for the sake of clarity, FIG. 2B also illustrates a plurality of light emitting elements 518 (for example, an inorganic or organic light emitting diodes) on the light emitting drive substrate, and the light emitting drive substrate is used for controlling the plurality of light emitting elements 518 to emit light.

As illustrated in FIG. 2B, each subregion 510 further comprises a plurality of bonding pads 513 (for example, four bonding pads 513) and a plurality of opposite bonding pads 514 (for example, four opposite bonding pads 514); at least part of the plurality of bonding pads 513 is electrically connected with the common electrode 511, at least part of the plurality of opposite bonding pads 514 is electrically connected with the opposite common electrode 512. The bonding pad 513 and the opposite bonding pad 514 that are adjacent to each other serve as one bonding pad set and are used for driving one light emitting element 518 to emit light. For example, the bonding pad 513 in the bonding pad set is connected with the first end (for example, the anode end) of the light emitting element 518, and the opposite bonding pad 514 in the bonding pad set is connected with the second end (for example, the cathode end) of the light emitting element 518. As illustrated in FIG. 2B, adjacent bonding pad sets which are in the same row are connected with each other (in series connection), so as to allow all the bonding pads 513 to be electrically connected with the common electrode 511, and allow all the opposite bonding pads 514 to be electrically connected with the opposite common electrode 512. For example, the opposite bonding pad 514 in the bonding pad set at the top left corner of the subregion 510 is connected with the bonding pad 513 in the bonding pad set at the top right corner of the subregion 510 through a wire 517. In the case where the bonding pad sets which are in the same row are in series connection, the voltage difference $\Delta V$ between the common electrode 511 and the opposite common electrode 512 are assigned to (for example, equally assigned to) the light emitting elements 518 provided on the bonding pad sets in the same row. For example, the voltage difference between the first end and the second end of each light emitting element 518 in FIG. 2B is about $\Delta V/2$. In same one subregion 510, because the bonding pads 513 in different rows are connected with the same common electrode 511, and the opposite bonding pads 514 in different rows are connected with the same opposite common electrode 512, the voltage differences (the voltage difference between the first end and the second end) received by the light emitting elements 518 provided on the bonding pad sets in different rows of the same subregion 510 are for example the same.

In display operation, the light emitting drive substrate may provide a required first power supply voltage and a required second power supply voltage respectively to the common electrode 511 and the opposite common electrode 512 of each subregion 510 according to the information of the image to be displayed. The above required first power supply voltage and second power supply voltage are transmitted to the plurality of bonding pads 513 and the plurality of opposite bonding pads 514 via the connection wire 517, so as to drive the plurality of light emitting elements 518 to emit light. For example, in the case where the image to be displayed comprises a black region (i.e., the region that does not comprise information), the difference between the first power supply voltage and the second power supply voltage received by a corresponding subregion 510 may be set to be zero, so as to allow the light emitting elements 518 in the above corresponding subregion 510 to emit no light.

The inventors of the present disclosure have noted that the widths (the widths in the second direction D2) of the plurality of power supply wires 515 of the light emitting drive substrate as illustrated in FIG. 2A and FIG. 2B are the same, that is, the light emitting drive substrate as illustrated in FIG. 2A and FIG. 2B adopts the design of equal wire width for the power supply wires. Because the lengths between the first ends and the second ends of the plurality of power supply wires 515 are not the same, the resistances between the first ends and the second ends of the plurality of power supply wires 515 are not the same, and therefore, the voltage drop values caused by the plurality of power supply wires 515 are not the same as well.

For example, in a backlight module of 12.3-inch size, the near-end resistance of the light emitting drive substrate in the backlight module (i.e., the resistance between the first end and the second end of the power supply wire 515 connected with the lower most subregion 510 as illustrated in FIG. 2A) is about 0.84 ohm, the distal end resistance (i.e., the resistance between the first end and the second end of the power supply wire 515 connected with the upper most subregion 510 as illustrated in FIG. 2A) of the light emitting drive substrate is about 3.16 ohm, the ratio of the distal end resistance to the near-end resistance is about 4, which causes that the difference of the voltage drop values caused by the plurality of power supply wires 515 to be relatively large.

For example, if the same first power supply voltage is applied to the plurality of power supply wires 515, the voltage received by the plurality of common electrodes 511 and the voltages received by the first electrodes of the light emitting elements 518 in different subregions 510 are different because that the voltage drop values caused by the plurality of power supply wires 515 are different, this causes the brightness (the intensity of the emitted light) of the light emitting elements 518 in different subregions 510 are different (the brightness is gradually increased along the direction from the upper region to the lower region in FIG. 2A), such that the light-emitting brightness of the backlight module including the light emitting drive substrate is inhomogeneous. For another example, in display operation, the deviations of the intensities of the emitted light of the light emitting elements 518 in different subregions 510 as compared to predetermined intensities of the emitted light are different because the voltage drop values caused by the plurality of power supply wires 515 are different, such that the display quality of the display device including the light emitting drive substrate is reduced, and display abnormity may be even caused.

For example, in the backlight module with a larger size, the wire length difference of the plurality of power supply wires in the light emitting drive substrate becomes even larger, the difference of the voltage drop values caused by the design of equal wire width is further increased, and the brightness inhomogeneity of the backlight module including the light emitting drive substrate is further increased and the display quality of the display device including the light emitting drive substrate is further decreased.

The inventors of the present disclosure have noted that the sums Vf (Vf=Vdata+Vcomp) of display voltages Vdata and compensation voltages Vcomp may be applied to the plurality of power supply wires 515 in order to suppress the inhomogeneous brightness of the backlight module due to the different voltage drop values caused by the plurality of power supply wires 515. Here, the display voltage Vdata applied to each power supply wire 515 is matched with the pre-determined brightness of the subregion 510 connected with the power supply wire 515 (the intensity of the light emitted by the light emitting elements 518 in the subregion 510 connected with the power supply wire 515), and the compensation voltage Vcomp applied to each power supply wire 515 is matched with the voltage drop value caused by the power supply wire 515. Different compensation voltages Vcomp are required to be applied to the power supply wires 515 by the drive circuit of the backlight module because the voltage drop values caused by the plurality of power supply wires 515 are different, such that the size and the structural complexity of the drive circuit of the backlight module are increased, the cost of the backlight module and the bezel size of the display device including the backlight module are increased, and the screen-to-body ratio of the display device including the backlight module is decreased.

Some embodiment of the present disclosure provides a light emitting drive substrate, a manufacturing method of a light emitting drive substrate, a light emitting substrate, and a display device. The light emitting drive substrate comprises a first light-emitting subregion, a second light-emitting subregion, a periphery area, a first power supply wire, and a second power supply wire. The first light-emitting subregion comprises a first common electrode, and the second light-emitting subregion comprises a second common electrode; the first power supply wire comprises a first end which is electrically connected with the first common electrode and a second end which is extended to the periphery area and is configured for electrically connection so as to receive a first power supply voltage; the second power supply wire comprises a first end which is electrically connected with the second common electrode and a second end which is extended to the periphery area and is configured for electrically connection so as to receive the first power supply voltage; a resistance between the first end of the first power supply wire and the second end of the first power supply wire is equal to a resistance between the first end of the second power supply wire and the second end of the second power supply wire; and a wire length between the first end of the first power supply wire and the second end of the first power supply wire is not equal to a wire length between the first end of the second power supply wire and the second end of the second power supply wire.

In some examples, through allowing the resistance between the first end of the first power supply wire and the second end of the first power supply wire to be equal to the resistance between the first end of the second power supply wire and the second end of the second power supply wire, the light-emitting homogeneity of the light emitting substrate including the light emitting drive substrate is increased while it is not necessary to apply different compensation voltages to different power supply wires, and therefore, the structure of the drive circuit of the light emitting drive substrate is simple, the size of the periphery area of the light emitting drive substrate is relatively small, such that the cost and the bezel size of the light emitting substrate including the light emitting drive substrate are decreased.

In some examples, through allowing the resistance between the first end of the first power supply wire and the second end of the first power supply wire to be equal to the resistance between the first end of the second power supply wire and the second end of the second power supply wire, the wire power loss, the wire load and the wire area of both the power supply wire and the opposite power supply wire can be reduced, such that the efficiency of the light emitting drive substrate can be increased, more wires and more subregions can be provided on the light emitting drive substrate, and the display quality of the display device including the light emitting drive substrate can be further increased.

Non-limitative descriptions are given to the light emitting drive substrate provided by the embodiments of the present disclosure in the following with reference to a plurality of examples. As described in the following, in case of no conflict, different features in these specific examples can be combined so as to obtain new examples, and the new examples are also fall within the scope of present disclosure.

Figure 3:
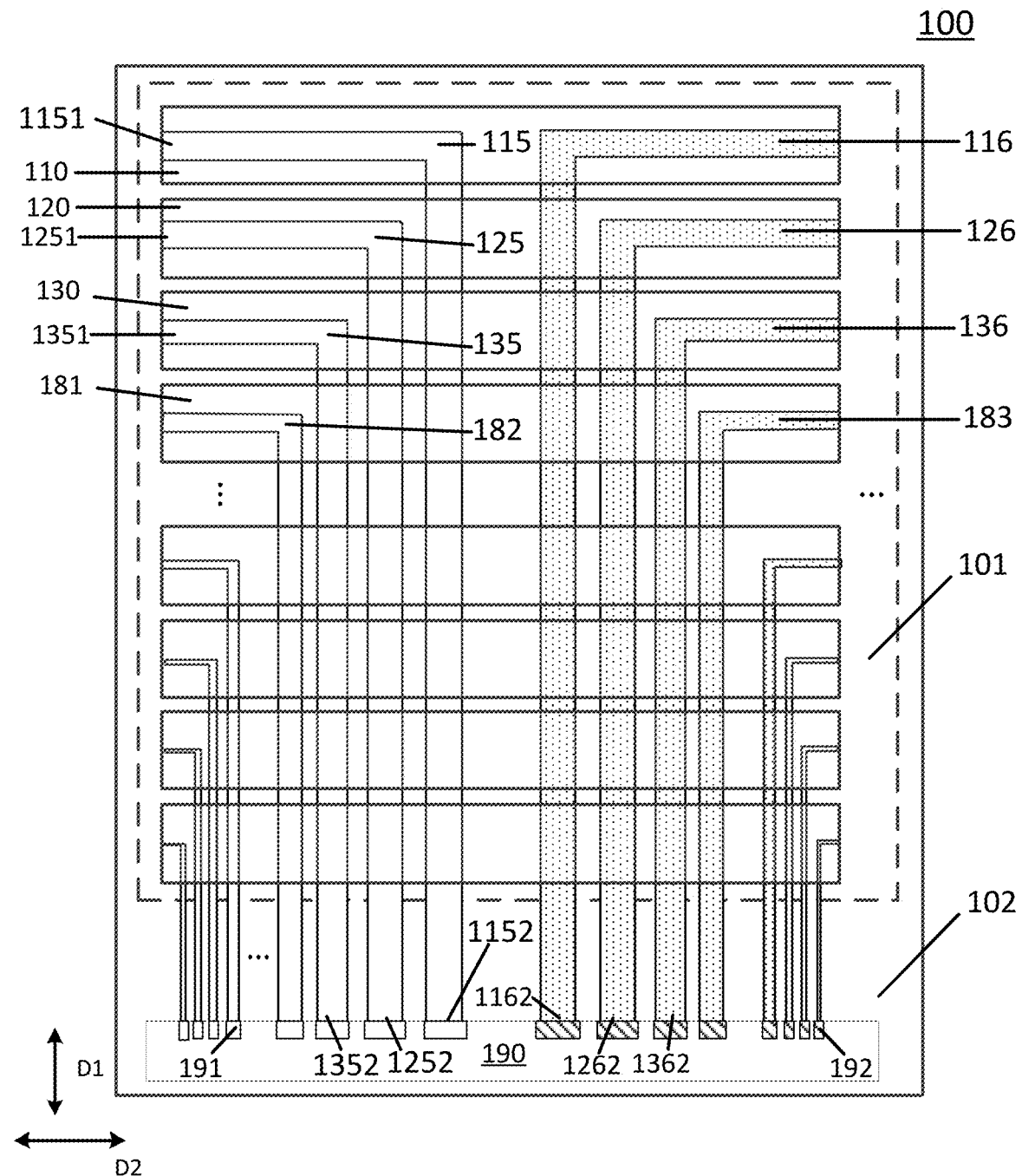
FIG. 3 is a schematic plan view of a light emitting drive substrate provided by at least one embodiment of the present disclosure.

FIG. 3 is a schematic plan view of a light emitting drive substrate 100 provided by at least one embodiment of the present disclosure. As illustrated in FIG. 3, the light emitting drive substrate 100 comprises a light emitting region 101 and a periphery area 102 at the outside of the light emitting region 101, a plurality of power supply wires, and a plurality of opposite power supply wires. The light emitting region 101 comprises a plurality of subregions, for example, a first light-emitting subregion 110, a second light-emitting subregion 120, a third light-emitting subregion 130, and so on. The plurality of power supply wires comprises a first power supply wire 115, a second power supply wire 125, a third power supply wire 135, and so on; the plurality of opposite power supply wire comprises a first opposite power supply wire 116, a second opposite power supply wire 126, a third opposite power supply wire 136, and so on.

As illustrated in FIG. 3, the plurality of subregions such as the first light-emitting subregion 110, the second light-emitting subregion 120 and the third light-emitting subregion 130 are arranged in the light emitting region 101 according to a pre-determined arrangement (for example, arranged in an array). For example, the power supply wires such as the first power supply wire 115, the second power supply wire 125 and the third power supply wire 135 are anode power supply wires; the opposite power supply wires such as the first opposite power supply wire 116, the second opposite power supply wire 126 and the third opposite power supply wire 136 are cathode power supply wires.

For example, the first light-emitting subregion 110, the second light-emitting subregion 120 and the third light-emitting subregion 130 are arranged in parallel along the first direction D1, the first power supply wire 115, the second power supply wire 125, the third power supply wire 135, the first opposite power supply wire 116, the second opposite power supply wire 126 and the third opposite power supply wire 136 are arranged in parallel along the second direction D2, and the second direction intersects (e.g., perpendicular to) the first direction D1.

Figure 4:
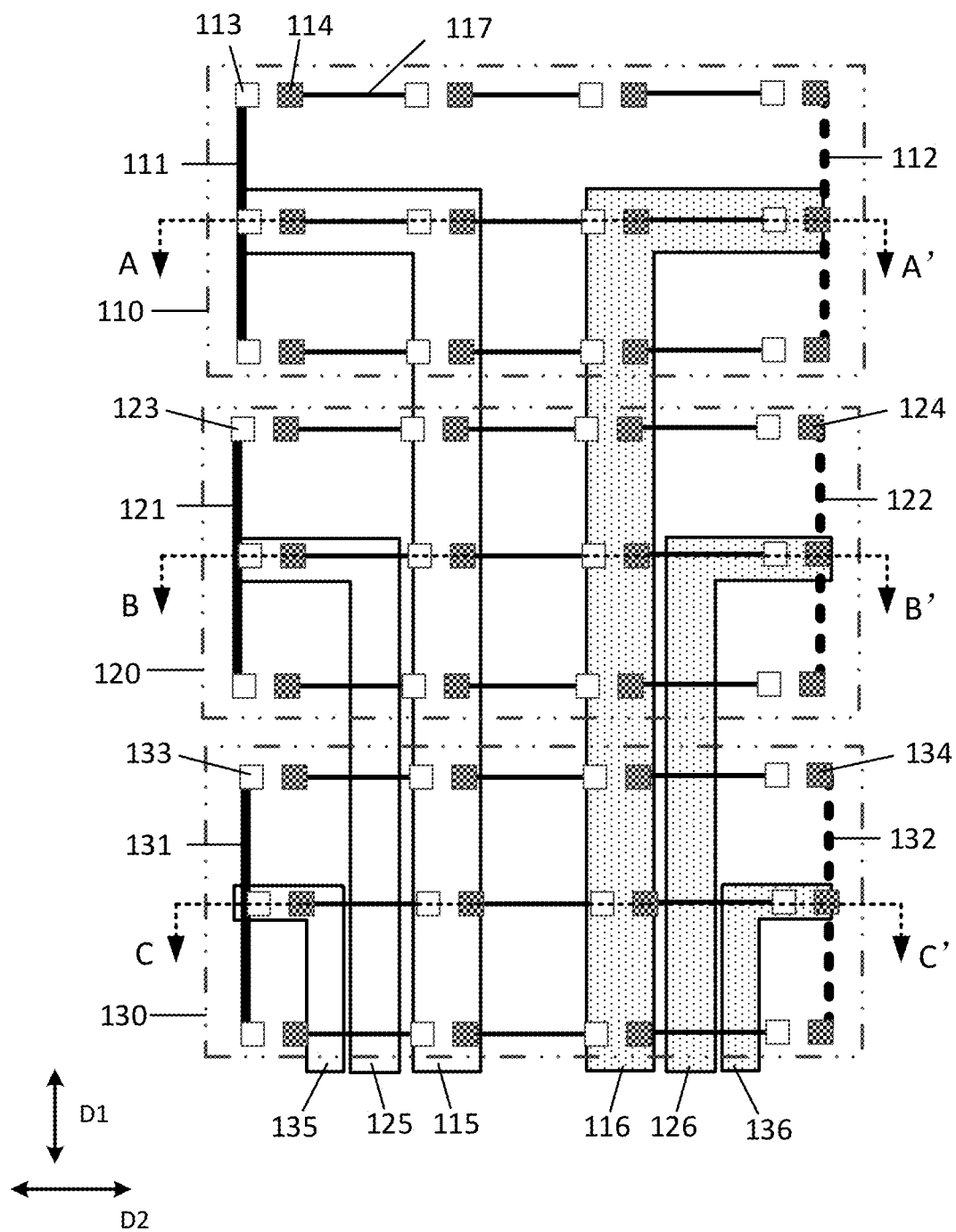
FIG. 4 is an enlarged diagram of a partially region of the light emitting drive substrate as illustrated in FIG. 3.

FIG. 4 is an enlarged diagram of a partially region of the light emitting drive substrate as illustrated in FIG. 3. FIG. 4 illustrates an enlarged diagram of the first light-emitting subregion 110, the second light-emitting subregion 120, the third light-emitting subregion 130, the first power supply wire 115, the second power supply wire 125, the third power supply wire 135, the first opposite power supply wire 116, the second opposite power supply wire 126 and the third opposite power supply wire 136 as illustrated in FIG. 3.

As illustrated in FIG. 4, the first light-emitting subregion 110 comprises a first common electrode 111, a first opposite common electrode 112, a plurality of first bonding pads 113, a plurality of first opposite bonding pads 114, and a first connection wire 117. For example, the first common electrode 111 may be implemented as a wire (for example, a wire for parallel connection of anodes) extending along the first direction D1, the first opposite common electrode 112 may be implemented as a wire (for example, a wire for parallel connection of cathodes) extending along the first direction D1, and the first connection wire 117 may be implemented as a wire (for example, a wire for series connection) extending along the second direction D2. For example, the wire for parallel connection of anodes is configured to transmit the first power supply voltage on the anode power supply wire to the bonding pads (for example, all the bonding pads which are directly connected with the wire for parallel connection of anodes and all the bonding pads which are indirectly and electrically connected with the wire for parallel connection of anodes) connected with the wire for parallel connection of anodes, and the wire for parallel connection of cathodes is configured to transmit the second power supply voltage on the cathode power supply wire to the opposite bonding pads (for example, all the opposite bonding pads which are directly connected with the wire for parallel connection of cathodes and all the opposite bonding pads which are indirectly and electrically connected with the wire for parallel connection of cathodes) connected with the wire for parallel connection of cathodes.

As illustrated in FIG. 4, the plurality of first bonding pads 113 may be electrically connected with the first common electrode 111, and the plurality of first opposite bonding pads 114 may be electrically connected with the first opposite common electrode 112. For example, as illustrated in FIG. 4, the plurality of first bonding pads 113 at the leftmost of the first light-emitting subregion 110 is directly and electrically connected with the first common electrode 111, and the plurality of first opposite bonding pads 114 at the rightmost of the first light-emitting subregion 110 is directly and electrically connected with the first opposite common electrode 112.

For example, as illustrated in FIG. 4, the plurality of first bonding pads 113 and the plurality of first opposite bonding pads 114 may form a plurality of first bonding pad sets, respectively; each of first bonding pad sets may comprise one first bonding pad 113 and one first opposite bonding pad 114, the first bonding pad 113 and the first opposite bonding pad 114 in each of first bonding pad sets are spaced apart and insulated with each other. In the example as illustrated in FIG. 4A, adjacent first bonding pad sets in the same row are connected (for example, connected in series) with each other through the first connection wire 117, so as to allow all the bonding pads to be able to electrically connect with the common electrode, and allow all the opposite bonding pads to electrically connect with the opposite common electrode.

It should be understood that, the arrangement of the plurality of first bonding pad sets as illustrated in FIG. 4 (i.e., twelve first bonding pad sets in an array of 4×3, and four first bonding pad sets in each row are in series connection) is only an example, and according to actually implementation demands, the arrangement of the first bonding pad sets in each first light-emitting subregion may also be an array of 4×1, that is, four first bonding pad sets are in parallel connection, and may also be an array of 1×4, that is, four first bonding pad sets are in series connection; obviously, the arrangement of the first bonding pad sets in each first light-emitting subregion may also be an array of 5×4, 4×4, 3×3, 2×2 or 1×1.

As illustrated in FIG. 4, the second light-emitting subregion 120 comprises a second common electrode 121, a second opposite common electrode 122, a plurality of second bonding pads 123, a plurality of second opposite bonding pads 124, and a second connection wire 127; the plurality of second bonding pads 123 may be electrically connected with the second common electrode 121; the plurality of second opposite bonding pads 124 may be electrically connected with the second opposite common electrode 122. For example, as illustrated in FIG. 4, the plurality of second bonding pads 123 and the plurality of second opposite bonding pads 124 may form a plurality of second bonding pads sets, respectively.

As illustrated in FIG. 4, the third light-emitting subregion 130 comprises a third common electrode 131, a third opposite common electrode 132, a plurality of third bonding pads 133, a plurality of third opposite bonding pads 134, and a third connection wire 137; the plurality of third bonding pads 133 are electrically connected with the third common electrode 131; the plurality of third opposite bonding pads 134 are electrically connected with the third opposite common electrode 132. For example, as illustrated in FIG. 4, the plurality of third bonding pads 133 and the plurality of third opposite bonding pads 134 may respectively form a plurality of third bonding pads sets.

For example, the arrangements of the second light-emitting subregion 120 and the third light-emitting subregion 130 may be referred to the first light-emitting subregion 110, and no further description will be given here.

It should be understood that, the above bonding pads may adopt an electrical contact section with electrically connection function, and no further description will be given here.

Figure 5A:
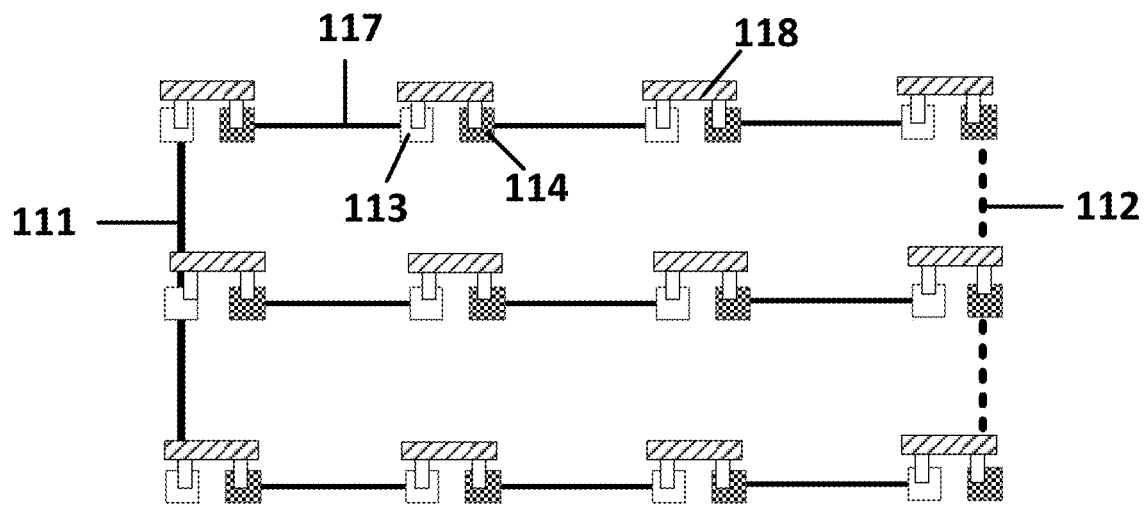
FIG. 5A illustrates an enlarged diagram of a partially region of a light emitting substrate provided by at least one embodiment of the present disclosure.

FIG. 5A illustrates an enlarged diagram of a partially region of a light emitting substrate including the light emitting drive substrate. FIG. 5A illustrates the first light-emitting subregion 110 and the plurality of first light emitting elements 118 at the first light-emitting subregion 110.

As illustrated in FIG. 5A and FIG. 4, the first bonding pads 113 of the first bonding pad sets in the first light-emitting subregion 110 are connected with the first ends (for example, the anode end) of the first light emitting elements 118, the first opposite bonding pads 114 of the first bonding pad sets are connected with the second ends (for example, the cathode end) of the first light emitting elements 118. Therefore, the first ends of the first light emitting elements 118 may receive the first power supply voltage that is transmitted through the first power supply wire 115 and the first common electrode 111, and the second ends of the first light emitting elements 118 may receive the second power supply voltage that is transmitted through the first opposite power supply wire 116 and the first opposite common electrode 112, such that the first light emitting elements 118 can emit light with corresponding intensities according to the values of the first power supply voltage and the second power supply voltage.

For example, the first power supply voltage and the second power supply voltage are configured to drive the light emitting elements in the subregions (for example, the first light-emitting subregion and the second light-emitting subregion) in operation.

Figure 5B:
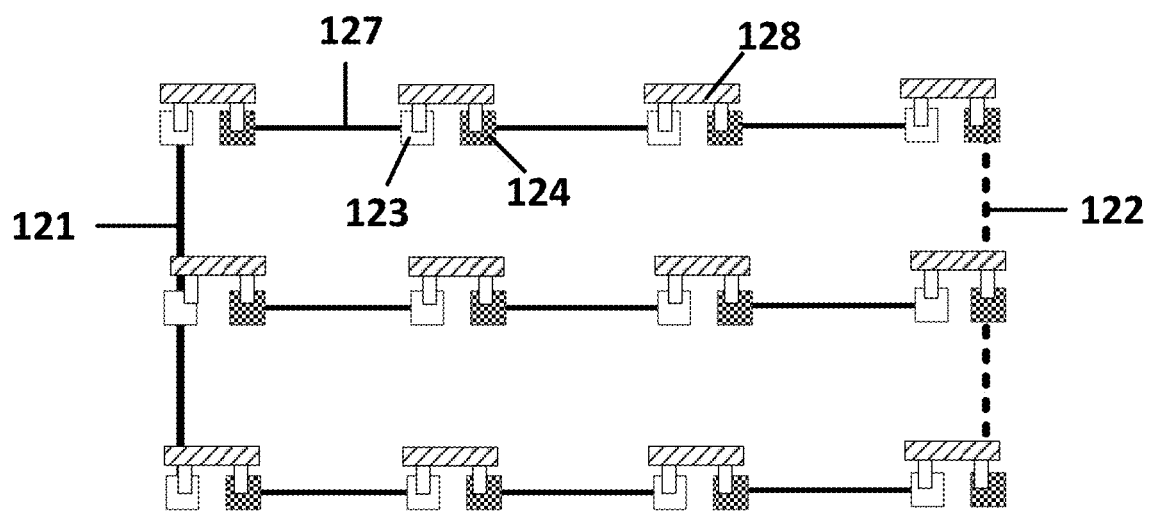
FIG. 5B illustrates an enlarged diagram of another partially region of a light emitting substrate provided by at least one embodiment of the present disclosure.

FIG. 5B illustrates an enlarged diagram of another partially region of a light emitting substrate including the light emitting drive substrate. FIG. 5B illustrates the second light-emitting subregion 120 and the plurality of second light emitting elements 128 in the second light-emitting subregion 120.

As illustrated in FIG. 5B and FIG. 4, the second bonding pads 123 of the second bonding pad sets in the second light-emitting subregion 120 are connected with the first ends (for example, the anode end) of the second light emitting elements 128, and the second opposite bonding pads 124 in the second bonding pad sets are connected with the second ends (for example, the cathode end) of the second light emitting elements 128. For example, the light emitting elements, for example, are mounted onto corresponding bonding pad sets through welding, bonding (using conductive adhesive) or the like. Therefore, the first ends of the second light emitting elements 128 may receive the first power supply voltage that is transmitted through the second power supply wire 125 (referring to FIG. 4) and the second common electrode 121, and the second ends of the second light emitting elements 128 may receive the second power supply voltage that is transmitted through the second opposite power supply wire 126 (referring to FIG. 4) and the second opposite common electrode 122, such that the second light emitting elements 128 can emit the light with corresponding intensities according to the values of the first power supply voltage and the second power supply voltage.

For example, the third light-emitting subregion 130 and the fourth light-emitting subregion 181 may be respectively provided with third light emitting elements and fourth light emitting elements, and no further description will be given here.

For example, the light emitting elements (the first light emitting element 118, the second light emitting element 128 and the like) may be organic light-emitting diodes or inorganic light-emitting diodes, which, for example, may emit white light (for example, the case where the light emitting substrate is applied in a backlight module), or, for example, may emit red light (R), green light (G), blue light (B), and so on (for example, the case where the light emitting substrate is applied in a display device). For example, in the case where the light emitting elements are implemented as inorganic light-emitting diodes, the light emitting elements may be submillimeter light-emitting diodes (Mini LED) or micro LEDs. Here, the submillimeter light-emitting diodes are light-emitting diodes with the size ranging from 100 micrometers to 1000 micrometers, and the micro LEDs are light-emitting diodes with the size smaller than 100 micrometers. No limitation will be given in the embodiment of the present disclosure regarding the type and the size of the light emitting elements.

In some example, according to actual implementation demands, each subregion may be provided with only one electrical contact section and one opposite electrical contact section, correspondingly, each subregion may be provided with only one light emitting element, and no further description will be given here.

For example, through providing the common electrodes (for example, the first common electrode 111 and the second common electrode 121), the opposite common electrodes (for example, the first opposite common electrode 112 and the second opposite common electrode 122), and the connection wires (for example, the first connection wire 117 and the second connection wire 127), each subregion can be used for driving a plurality of light emitting elements, such that the number of the power supply wires and the opposite power supply wires can be decreased and the maximum brightness difference (for example, the product of the maximum brightness of each light emitting element and the number of the light emitting elements in each subregion) between different subregions can be increased, while the size and the brightness of the light emitting substrate remain unchanged. Therefore, the light emitting substrate including the light emitting drive substrate 100 can have a larger size, and the display device including the light emitting drive substrate 100 can have a larger size and a larger contrast ratio.

For example, in the case where the bonding pad sets in the same row are in series connection, the voltage difference $\Delta V$ between the common electrode and the opposite common electrode is assigned to (for example, equally assigned to) the light emitting elements provided on the bonding pad sets in the same row. For example, the voltage difference between the first end and the second end of each light emitting element in FIG. 5 is about $\Delta V/4$. For example, in the same subregion, because the bonding pads in different rows are connected with the same common electrode, and the opposite bonding pads in different rows are connected with the same opposite common electrode, the voltage differences (the voltage difference between the first end and the second end) received by the light emitting elements provided on the bonding pad sets in different rows of the same subregion are for example the same.

As illustrated in FIG. 3 and FIG. 4, the first power supply wire 115 comprises a first end 1151 which is electrically connected with the first common electrode 111 and a second end 1152 which is extended to the periphery area 102 and is configured for electrically connection so as to receive the first power supply voltage; the second power supply wire 125 comprises a first end 1251 which is electrically connected with the second common electrode 121 and a second end 1252 which is extended to the periphery area 102 and is configured for electrically connection so as to receive the first power supply voltage; the third power supply wire 135 comprises a first end 1351 which is electrically connected with the third common electrode 131 and a second end 1352 which is extended to the periphery area 102 and is configured for electrically connection so as to receive the first power supply voltage.

As illustrated in FIG. 3 and FIG. 4, the first opposite power supply wire 116 comprises a first end 1161 which is electrically connected with the first opposite common electrode 112 and a second end 1162 which is extended to the periphery area 102 and is configured for electrically connection so as to receive the second power supply voltage; the second opposite power supply wire 126 comprises a first end 1261 which is electrically connected with the second opposite common electrode 122 and a second end 1262 which is extended to the periphery area 102 and is configured for electrically connection so as to receive the second power supply voltage; the third opposite power supply wire 136 comprises a first end 1361 which is electrically connected with the third opposite common electrode 132 and a second end 1362 which is extended to the periphery area 102 and is configured for electrically connection so as to receive the second power supply voltage.

For example, as illustrated in FIG. 3, the second end 1152 of the first power supply wire 115, the second end 1252 of the second power supply wire 125, the second end 1352 of the third power supply wire 135, the second end 1162 of the first opposite power supply wire 116, the second end 1262 of the second opposite power supply wire 126 and the second end 1362 of the third opposite power supply wire 136 are all at the same side of the light emitting region 101 (for example, the lower side of the light emitting region 101 in FIG. 3). For example, as illustrated in FIG. 3, the light emitting drive substrate 100 further comprises a drive circuit 190, the drive circuit 190 for example is connected with the system power supply of an electronic device (for example, a display device), and is configured for applying light-emitting driving voltages (for example, the first power supply voltage and the second power supply voltage) to light emitting regions. The drive circuit 190 and the second ends of the plurality of power supply wires are at the same side (for example, the lower side of the light emitting region 101 in FIG. 3) of the light emitting region 101.

For example, as illustrated in FIG. 3, the drive circuit 190 comprises a plurality of first power supply voltage terminals 191 and a plurality of second power supply voltage terminals 192. The plurality of first power supply voltage terminals 191 are respectively connected with the plurality of power supply wires (for example, the first power supply wire 115, the second power supply wire 125 and the third power supply wire 135), and are configured to apply corresponding first power supply voltages to the plurality of power supply wires; the plurality of second power supply voltage terminals 192 are respectively connected with the plurality of opposite power supply wires (for example, the first opposite power supply wire 116, the second opposite power supply wire 126 and the third opposite power supply wire 136), and are configured to apply corresponding second power supply voltages to the plurality of opposite power supply wires. For example, the second power supply voltage is smaller than the first power supply voltage. For example, the second power supply voltage applied to the first opposite power supply wire 116 is smaller than the first power supply voltage applied to the first power supply wire 115. For example, the first power supply voltage may be a positive voltage. For example, the second power supply voltage terminals 192 may be grounded, that is, the second power supply voltage applied to the opposite power supply wires by the second power supply voltage terminals 192 may be zero volt.

For example, the first power supply voltages applied to the first power supply wire 115, the second power supply wire 125 and the third power supply wire 135 by the plurality of first power supply voltage terminals 191, as well as the second power supply voltages applied to the first opposite power supply wire 116, the second opposite power supply wire 126 and the third opposite power supply wire 136 by the plurality of second power supply voltage terminals 192, may respectively be determined by the light-emitting brightness of the first light-emitting subregion 110, the light-emitting brightness of the second light-emitting subregion 120, and the light-emitting brightness of the third light-emitting subregion 130. For example, the first power supply voltages applied to the first power supply wire 115, the second power supply wire 125 and the third power supply wire 135 by the plurality of first power supply voltage terminals 191 may be the same or different; the second power supply voltages applied to the first opposite power supply wire 116, the second opposite power supply wire 126 and the third opposite power supply wire 136 by the plurality of second power supply voltage terminals 192 may be the same or different, and no further description will be given here.

For example, the resistance between the first end 1151 and the second end 1152 of the first power supply wire 115, the resistance between the first end 1251 and the second end 1252 of the second power supply wire 125, and the resistance between the first end 1353 and the second end 1352 of the third power supply wire 135 are the same, that is, as illustrated in FIG. 3 and FIG. 4, the light emitting drive substrate adopts a design of equal resistance for the power supply wires. In the case where the light emitting drive substrate adopts the design of equal resistance for the power supply wires, the voltage drop caused by the first power supply wire 115, the voltage drop caused by the second power supply wire 125, and the voltage drop caused by the third power supply wire 135 become the same.

For example, in the case where the first power supply voltage received by the first power supply wire 115, the first power supply voltage received by the second power supply wire 125, and the first power supply voltage received by the third power supply wire 135 are the same, because the resistance between the first end 1151 and the second end 1152 of the first power supply wire 115, the resistance between the first end 1251 and the second end 1252 of the second power supply wire 125 are the same, the voltage received by the first common electrode 111, the voltage received by the second common electrode 121 and the voltage received by the third common electrode 131 are the same. In the case where the voltage received by the first common electrode 111, the voltage received by the second common electrode 121, and the voltage received by the third common electrode 131 are the same, the difference among the intensity of the light emitted by the first light emitting element 118 in the first light-emitting subregion 110, the intensity of the light emitted by the second light emitting element 128 in the second light-emitting subregion 120, and the intensity of the light emitted by the third light emitting element in the third light-emitting subregion 130 is decreased (for example, the difference among the intensities of the emitted light is decreased to zero), and the light-emitting homogeneity of the light emitting substrate including the light emitting drive substrate 100 as illustrated in FIG. 3 is increased while it is not necessary to apply different compensation voltages to different power supply wires, and therefore, the structure of the drive circuit 190 of the light emitting drive substrate 100 as illustrated in FIG. 3 is simple, and the size of the periphery area 102 of the light emitting drive substrate 100 is relatively small, such that the cost and the bezel size of the light emitting substrate including the light emitting drive substrate 100 as illustrated in FIG. 3 are decreased.

For example, the inventors of the present disclosure have further noted during research that, as compared to the design of equal wire width for the power supply wires, the design of equal resistance for the power supply wires can decrease the area of the power supply wires and the wire loss of the power supply wires (for example, the power loss caused by the wires). Illustrative descriptions are given in the following with reference to the light emitting drive substrate 100 and the backlight module of a display device of 65-inch size (with 4K resolution).

For example, for the display device of 65-inch size, the resolution is 3840×2160, the color gamut is 80% (BT2020 standard), the contrast ratio is 2 million:1, the optical distance (for example, the working distance) is 5 meters, the nominal brightness is 800 nit, and the maximum brightness (i.e., overdrive brightness) is 2000 nit. The number of the subregions of the light emitting drive substrate is 1536 (48×32); each subregion may be provided with twelve first light emitting elements 118; the center-to-center spacing (pitch) of adjacent first light emitting elements 118 in the row direction is about 7.44 millimeters, and the center-to-center spacing (pitch) of adjacent first light emitting elements 118 in the column direction is about 8.37 millimeters. For example, the twelve first light emitting elements 118 form an array of 4×3 for the first light emitting elements, the first light emitting elements 118 in the same row are sequentially connected in series, and the first light emitting elements 118 in different rows are arranged in parallel.

For example, for the display device of 65-inch size, in the case where the light emitting drive substrate 100 of the display device adopts the design of equal wire width for the power supply wires, the near-end resistance and the distal end resistance of the plurality of power supply wires (copper-containing metal wires) are respectively about 0.4 ohm and 4.24 ohm, the maximum of the resistance difference of the plurality of power supply wires is about 3.84 ohm, this causes that the maximum of the difference of the voltage drop values caused by the plurality of power supply wires is about 1 volt, the overall wire loss of the plurality of power supply wires and the plurality of opposite power supply wires is about 19.5 watt, the efficiency of the backlight module is about 91%. For example, the average wire length of the plurality of power supply wires is about 729 micrometers. Here, the efficiency of the backlight module is the portion, which is not dissipated by the power supply wire and the opposite power supply wire, is transmitted to the common electrode and the opposite common electrode and is used for driving the light emitting elements, of the power provided by the drive circuit 190.

For example, for the display device of 65-inch size, in the case where the light emitting drive substrate 100 of the display device adopts the design of equal resistance for the power supply wires and the widths of the plurality of power supply wires decrease according to an arithmetic progression, all the resistances of the plurality of power supply wires and the resistances of the plurality of opposite power supply wires are about 1.03 ohm, the overall wire loss of the plurality of power supply wires and the plurality of opposite power supply wires is about 9.62 watt, the efficiency of the backlight module is 98.2%, and it can be seen that the wire design of equal resistance can reduce the wire loss and the load of the power supply wires and the opposite power supply wires, such that the efficiency of the light emitting drive substrate 100 can be increased. For example, the light emitting drive substrate 100 comprises 16 drive circuits (driver), and each drive circuit provides a driving voltage to part of the power supply wires and part of the opposite power supply wires, the driving voltage provided by each drive circuit is about 11.64 volts. For example, the thickness of the power supply wires is about 38. 97 micrometers. For example, the minimum width and the maximum width of the plurality of power supply wires are respectively 12.5 micrometers and 400.6 micrometers, and it can be seen that the wire design of equal resistance can reduce the area of the plurality of power supply wires and the plurality of opposite power supply wires (for example, the sum of the areas of orthographic projections of the plurality of power supply wires and the plurality of opposite power supply wires on a plane parallel to the first direction D1 and the second direction D2), and in such a case, the light emitting drive substrate 100 can be provided with more wires and more subregions, such that the number of the light emitting elements driven by each subregion and the size of the subregion can be reduced, the size of the driving circuit can be reduced, and the display quality of the display device including the light emitting drive substrate 100 may be further increased.

Figure 6:
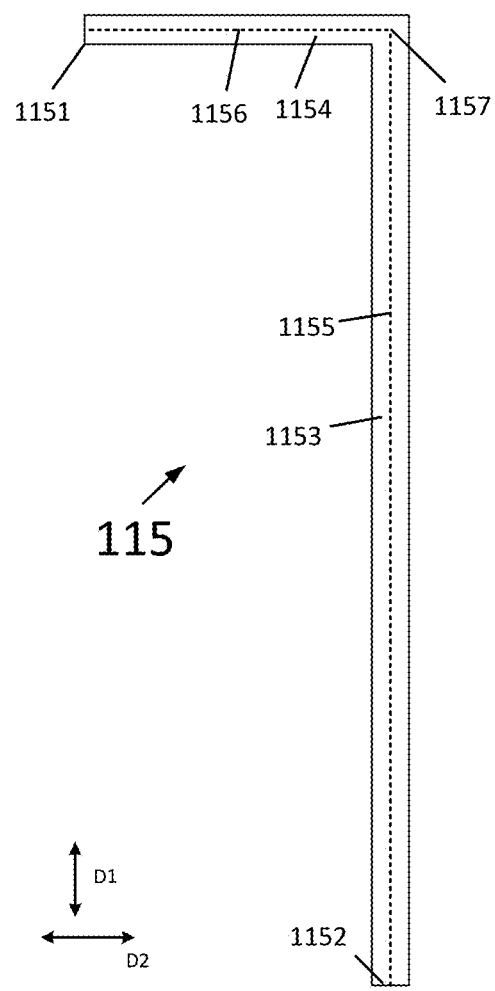
FIG. 6 is an enlarged diagram of a first wire of the light emitting drive substrate as illustrated in FIG. 3.

For example, FIG. 6 is an enlarged diagram of the first power supply wire 115 of the light emitting drive substrate as illustrated in FIG. 3. As illustrated in FIG. 6, the first power supply wire 115 comprises a first portion 1153 extending along the first direction D1 and a second portion 1154 extending along the second direction D2. For example, the first portion 1153 of the first power supply wire 115 have a uniform width (the width in the second direction D2) and a uniform thickness (the thickness in the direction perpendicular to the first direction D1 and the second direction D2). The second portion 1154 of the first power supply wire 115 also have a uniform width (the width in the first direction D1) and a uniform thickness (the thickness in the direction perpendicular to the first direction D1 and the second direction D2). Further, the width of the first portion 1153 of the first power supply wire 115 is equal to the width of the second portion 1154 of the first power supply wire 115, and the thickness of the first portion 1153 of the first power supply wire 115 is equal to the thickness of the second portion 1154 of the first power supply wire 115.

As illustrated in FIG. 6, the first portion 1153 of the first power supply wire 115 comprises a central axis 1155 (the central axis 1155 extending along the first direction D1), and the second portion 1154 of the first power supply wire 115 comprises a central axis 1156 (a central axis 1156 extending along the second direction D2). The central axis 1155 of the first portion 1153 and the central axis 1156 of the second portion 1154 intersect at an intersection 1157. For example, the length between the first end 1151 and the second end 1152 of the first power supply wire 115 is a first wire length, the central axis 1155 have a second wire length for the length between the first end 1151 of the first power supply wire 115 and the intersection 1157, and the central axis 1156 have a third wire length for the length between the second end 1152 of the first power supply wire 115 and the intersection 1157; here, the first wire length is equal to the sum of the second wire length and the third wire length. For example, in the case where the first power supply wire 115 further comprises other portions or the first power supply wire 115 adopts another shape, the length of the first power supply wire 115 may be the extending length of the portion, from the first end 1151 of the first power supply wire 115 to the second end 1152 of the first power supply wire 115, of the central axis of the first power supply wire 115. For example, the wire length of other power supply wires (for example, the second power supply wire 125, the third power supply wire 135, the first opposite power supply wire 116, the second opposite power supply wire 126 and the third opposite power supply wire) of the light emitting drive substrate 100 have similar definition, and no further description will be given.

As illustrated in FIG. 3 and FIG. 4, the wire length between the first end 1151 and the second end 1152 of the first power supply wire 115, the wire length between the first end 1251 and the second end 1252 of the second power supply wire 125, and the wire length between the first end 1353 and the second end 1352 of the third power supply wire 135 are different (for example, gradually decreased). For example, the wire length between the first end 1151 and the second end 1152 of the first power supply wire 115, the wire length between the first end 1251 and the second end 1252 of the second power supply wire 125, and the wire length between the first end 1353 and the second end 1352 of the third power supply wire 135 decrease according to an arithmetic progression. That is, the difference between the wire length between the first end 1151 and the second end 1152 of the first power supply wire 115 and the wire length between the first end 1251 and the second end 1252 of the second power supply wire 125, is equal to the difference between the wire length between the first end 1251 and the second end 1252 of the second power supply wire 125 and the wire length between the first end 1353 and the second end 1352 of the third power supply wire 135.

As illustrated in FIG. 3 and FIG. 4, the wire width of the first power supply wire 115, the wire width of the second power supply wire 125, and the wire width of the third power supply wire 135 are different (for example, gradually decreased). For example, the wire width of the first power supply wire 115, the wire width of the second power supply wire 125 and the wire width of the third power supply wire 135 are decreased according to an arithmetic progression, that is, the difference between the wire width of the first power supply wire 115 and the wire width of the second power supply wire 125, is equal to the difference between the wire width of the second power supply wire 125 and the wire width of the third power supply wire 135. For example, through allowing the wire lengths of the first power supply wire 115, the second power supply wire 125 and the third power supply wire 135 to be decreased according to an arithmetic progression, and allowing the wire widths of the first power supply wire 115, the second power supply wire 125, and the third power supply wire 135 to be decreased according to an arithmetic progression, the change of the wire lengths and the wire widths of the first power supply wire 115, the second power supply wire 125 and the third power supply wire 135 can become more uniform, such that the performance of the light emitting drive substrate 100 can be further increased.

For example, the expression of the resistance R between the first end and the second end of the power supply wire (for example, the first to third power supply wire 115-135, and the first to third opposite power supply wire 116-136) is as follows:

$$R = R0 \times L / (W \times H).$$

Here, L is the wire length between the first end and the second end of the power supply wire, W is the wire width of the power supply wire, H is the thickness of the power supply wire, and R0 is a constant value.

As illustrated in FIG. 6, the first portions of the plurality of power supply wires (the first power supply wire 115, the second power supply wire 125 and the third power supply wire 135) and the first portions of the plurality of opposite power supply wires (the first opposite power supply wire 116, the second opposite power supply wire 126 and the third opposite power supply wire 136) are arranged in parallel along the second direction D2; the second portions of the plurality of power supply wires (the first power supply wire 115, the second power supply wire 125 and the third power supply wire 135) and the second portions of the plurality of opposite power supply wires (the first opposite power supply wire 116, the second opposite power supply wire 126 and the third opposite power supply wire 136) are arranged in parallel along the first direction D1.

For example, for the case where the thickness of the first power supply wire 115, the thickness of the second power supply wire 125 and the thickness of the third power supply wire 135 are the same, when the ratio of the wire length between the first end 1151 and the second end 1152 of the first power supply wire 115 to the wire length between the first end 1251 and the second end 1252 of the second power supply wire 125, is equal to the ratio of the width of the wire between the first end 1151 and the second end 1152 of the first power supply wire 115 to the width of the wire between the first end 1251 and the second end 1252 of the second power supply wire 125, the resistance between the first end 1151 and the second end 1152 of the first power supply wire 115 is equal to the resistance between the first end 1251 and the second end 1252 of the second power supply wire 125; when the ratio of the wire length between the first end 1353 and the second end 1352 of the third power supply wire 135 to the wire length between the first end 1251 and the second end 1252 of the second power supply wire 125, is equal to the ratio of the width of the wire between the third end and the second end of the first power supply wire 115 to the width of the wire between the first end 1251 and the second end 1252 of the second power supply wire 125, the resistance between the first end 1353 and the second end 1352 of the third power supply wire 135 is equal to the resistance between the first end 1251 and the second end 1252 of the second power supply wire 125.

For example, the resistance between the first end and the second end of the first opposite power supply wire 116, the resistance between the first end and the second end of the second opposite power supply wire 126, and the resistance between the first end and the second end of the third opposite power supply wire 136 may be the same as well. This allows the voltage drop value caused by the first opposite power supply wire 116, the voltage drop value caused by the second opposite power supply wire 126 and the voltage drop value caused by the third opposite power supply wire 136 to be the same, and allows the difference among the intensity of the light emitted by the first light emitting element 118 in the first light-emitting subregion 110, the intensity of the light emitted by the second light emitting element 128 in the second light-emitting subregion 120 and the intensity of the light emitted by the third light emitting element in the third light-emitting subregion 130 to be further decreased (for example, the difference of the intensities of the emitted light is decreased to zero), and allows the light-emitting homogeneity of the light emitting substrate including the light emitting drive substrate 100 as illustrated in FIG. 3 to be further increased.

As illustrated in FIG. 3 and FIG. 4, the wire length between the first end and the second end of the first opposite power supply wire 116, the wire length between the first end and the second end of the second opposite power supply wire 126, and the wire length between the first end and the second end of the third opposite power supply wire 136 are different (for example, gradually decreased). For example, the wire length between the first end and the second end of the first opposite power supply wire 116, the wire length between the first end and the second end of the second opposite power supply wire 126, and the wire length between the first end and the second end of the third opposite power supply wire 136 are decreased according to an arithmetic progression.

As illustrated in FIG. 3 and FIG. 4, the wire width of the first opposite power supply wire 116, the wire width of the second opposite power supply wire 126, and the wire width of the third opposite power supply wire 136 are different (for example, gradually decreased). For example, the wire width of the first opposite power supply wire 116, the wire width of the second opposite power supply wire 126, and the wire width of the third opposite power supply wire 136 are decreased according to an arithmetic progression. For example, through allowing the wire lengths of the first opposite power supply wire 116, the second opposite power supply wire 126 and the third opposite power supply wire 136 to be decreased according to an arithmetic progression, and allowing the wire widths of the first opposite power supply wire 116, the second opposite power supply wire 126 and the third opposite power supply wire 136 to be decreased according to an arithmetic progression, the change of the wire lengths and the wire widths of the first opposite power supply wire 116, the second opposite power supply wire 126 and the third opposite power supply wire 136 can be more uniform, such that the performance of the light emitting drive substrate 100 can be further increased.

For example, for the case where the thickness of the first opposite power supply wire 116, the thickness of the second opposite power supply wire 126, and the thickness of the third opposite power supply wire 136 are the same, when the ratio of the wire length between the first end and the second end of the first opposite power supply wire 116 to the wire length between the first end and the second end of the second opposite power supply wire 126, is equal to the ratio of the width of the wire between the first end and the second end of the first opposite power supply wire 116 to the width of the wire between the first end and the second end of the second opposite power supply wire 126, the resistance between the first end and the second end of the first opposite power supply wire 116 is equal to the resistance between the first end and the second end of the second opposite power supply wire 126; when the ratio of the wire length between the first end and the second end of the third opposite power supply wire 136 to the wire length between the first end and the second end of the second opposite power supply wire 126, is equal to the ratio of the width of the wire between the third end and the second end of the first opposite power supply wire 116 to the width of the wire between the first end and the second end of the second opposite power supply wire 126, the resistance between the first end and the second end of the third opposite power supply wire 136 is equal to the resistance between the first end and the second end of the second opposite power supply wire 126.

As illustrated in FIG. 3, the light emitting drive substrate 100 may further comprise more subregions (for example, a fourth light-emitting subregion 181), more power supply wires (for example, a fourth power supply wire 182), and more opposite power supply wires (for example, a fourth opposite power supply wire 183). The specific settings of the above other subregion, other power supply wires and other opposite power supply wires may be referred to the first light-emitting subregion 110, the first power supply wire 115, and the first opposite power supply wire 116, and no further description will be given here. It should be understood that, for the sake of clarity, the light emitting drive substrate 100 as illustrated in FIG. 3 only illustrates one column of subregions, but embodiments of the present disclosure are not limited to this case; according to actual implementation demands, the light emitting drive substrate 100 may comprise a plurality of subregions arranged in an array, and the plurality of subregions are arranged into a plurality of rows along the first direction D1 and a plurality of columns along the second direction D2; in this case, the arrangement of the plurality of subregions is similar to the arrangement of the plurality of subregions as illustrated in FIG. 2A, and no further description will be given here.

For example, the light emitting drive substrate 100 is in a structure with multilayers. For example, the light emitting drive substrate 100 may be implemented as a multilayer printed circuit board or the like. In the structure with multilayers, for example, the plurality of first bonding pads 113, the plurality of first opposite bonding pads 114, the plurality of second bonding pads 123, the plurality of second opposite bonding pads 124, the plurality of third bonding pads 133, the plurality of third opposite bonding pads 134, the first common electrode 111, the first opposite common electrode 112, the second common electrode 121, the second opposite common electrode 122, the third common electrode 131 and the third opposite common electrode 132 are in the same layer. For example, the first power supply wire 115, the second power supply wire 125, the third power supply wire 135, the first opposite power supply wire 116, the second opposite power supply wire 126 and the third opposite power supply wire 136 are in the same layer.

Figure 7:
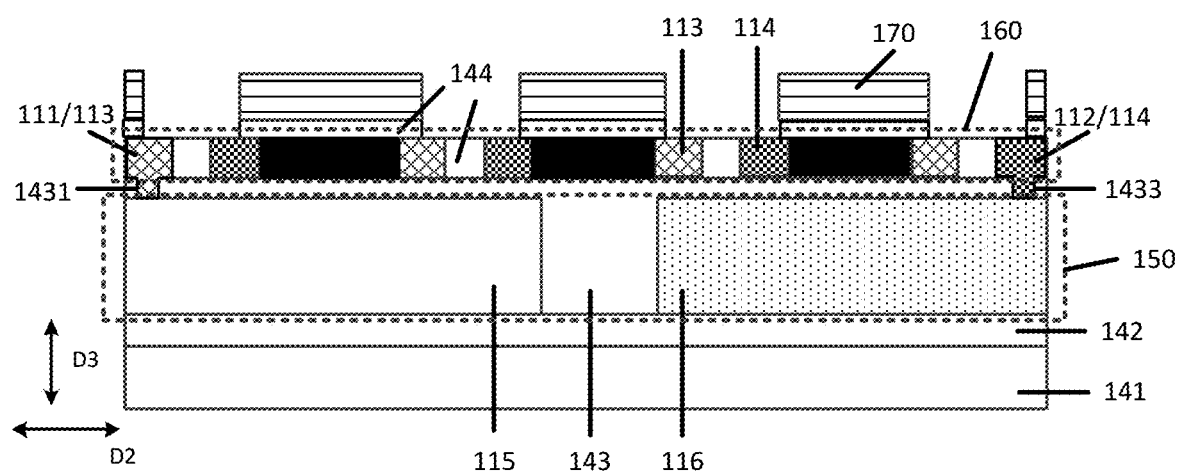
FIG. 7 is a cross-sectional view along line AA' of the light emitting drive substrate as illustrated in FIG. 4.
Figure 8:
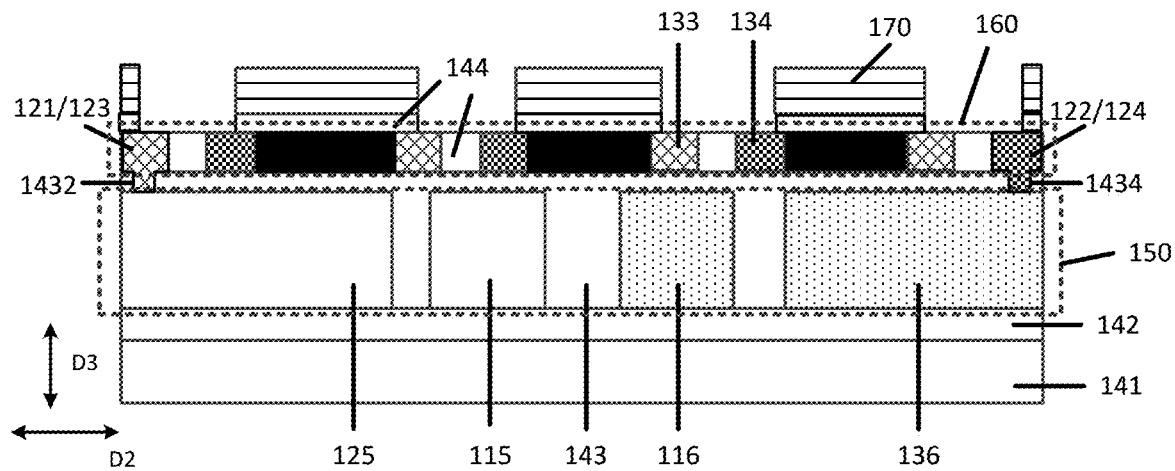
FIG. 8 is a cross-sectional view along line BB' of the light emitting drive substrate as illustrated in FIG. 4.
Figure 9:
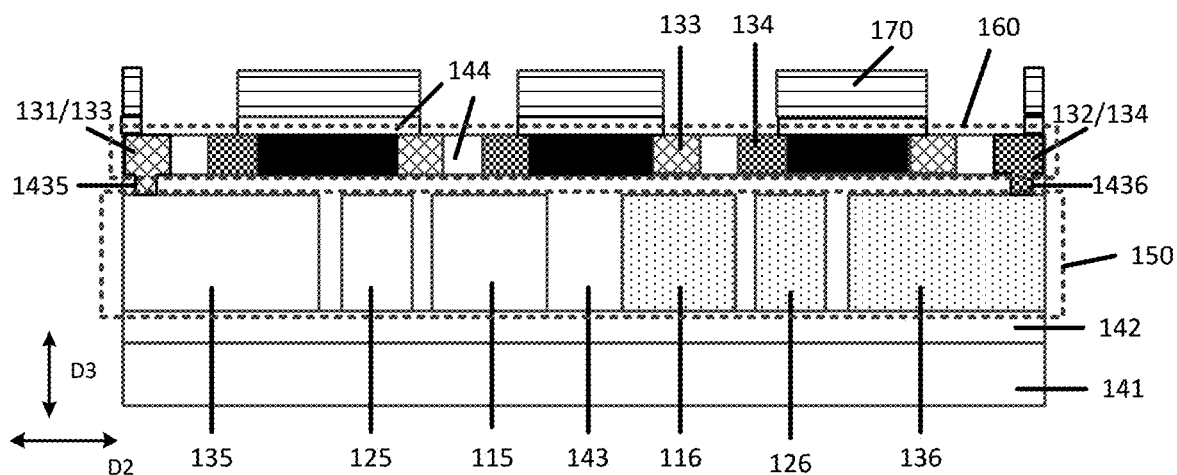
FIG. 9 is a cross-sectional view along line CC' of the light emitting drive substrate as illustrated in FIG. 4.

FIG. 7, FIG. 8 and FIG. 9 illustrate cross-sectional views of illustrative light emitting drive substrate 100 as illustrated in FIG. 4 along line AA', line BB' and line CC', respectively. As illustrated in FIG. 7-FIG. 9, the light emitting drive substrate 100 comprises a base substrate 141, a stress buffer layer 142, a second electrode layer 150, a first insulation layer 143, a first electrode layer 160, a second insulation layer 144 and a reflective layer 170 which are sequentially arranged along the third direction D3. The third direction D3 intersects (for example, is perpendicular to) the first direction D1 and the second direction D2.

For example, the base substrate 141 may be a glass substrate, a quartz substrate, a plastic substrate (for example, a polyethylene terephthalate (PET) substrate) or a substrate made of other suitable materials, and the base substrate 141 may be lighter and thinner, so as to decrease the thickness of and the manufacturing cost of the light emitting drive substrate 100.

As illustrated in FIG. 7-FIG. 9, the first electrode layer 160 comprises the plurality of first bonding pads 113, the plurality of first opposite bonding pads 114, the plurality of second bonding pads 123, the plurality of second opposite bonding pads 124, the plurality of third bonding pads 133, the plurality of third opposite bonding pads 134, the first common electrode 111, the first opposite common electrode 112, the second common electrode 121, the second opposite common electrode 122, the third common electrode 131, and the third opposite common electrode 132. The second electrode layer 150 comprises the first power supply wire 115, the second power supply wire 125, the third power supply wire 135, the first opposite power supply wire 116, the second opposite power supply wire 126, and the third opposite power supply wire 136. In some examples, as illustrated in FIG. 8, when forming the second insulation layer 144 on the first electrode layer 160, the material for forming the second insulation layer 144 may be filled in the gap between the bonding pad and a corresponding opposite bonding pad, and the material filled in the gap between the bonding pad and the corresponding opposite bonding pad and used for forming the second insulation layer 144, for example, may serve as a portion of the second insulation layer 144. In some other examples, in the final products of the light emitting substrate, the gap between the bonding pad and the corresponding opposite bonding pad does not comprise the material for forming the second insulation layer 144.

It should be understood that, for the sake of clarity, the cross-section shapes of the first to third power supply wires 115-135 and the first to third opposite power supply wires 116-136 as illustrated in FIG. 7-FIG. 9 are rectangles, but embodiments of the present disclosure are not limited to this case. For example, the cross-section shapes of the first to third power supply wires 115-135 and the first to third opposite power supply wires 116-136 may also be trapezoids; in this case, the wire width of the first to third power supply wires 115-135 and the first to third opposite power supply wires 116-136 is the length of the base of the trapezoid (i.e., the length of the longer base in the set of parallel bases of the trapezoid).

As illustrated in FIG. 7-FIG. 9, the first insulation layer 143 comprises a first through hole 1431, a second through hole 1432, a third through hole 1433, a fourth through hole 1434, a five through hole 1435 and a six through hole 1436. The first power supply wire 115 is electrically connected with the first common electrode 111 via the first through hole 1431, the second power supply wire 125 is electrically connected with the second common electrode 12 via the second through hole 1432, and the third power supply wire 135 is electrically connected with the third common electrode 131 via the five through hole 1435; the first opposite power supply wire 116 is electrically connected with the first opposite common electrode 112 via the third through hole 1433, the second opposite power supply wire 126 is electrically connected with the second opposite common electrode 122 via the fourth through hole 1434, and the third opposite power supply wire 136 is electrically connected with the third opposite common electrode 132 via the six through hole 1436.

For example, the first insulation layer 143 may be a resin. For example, the second insulation layer 144 may be made of inorganic or organic materials. For example, the second insulation layer 144 may be made of organic resin, silicon oxide (SiOx), silicon oxynitride (SiNxOy) or silicon nitride (SiNx).

Figure 10:
FIG. 10 is a cross-sectional view of a second conductive layer provided by at least one embodiment of the present disclosure.
Figure 11:
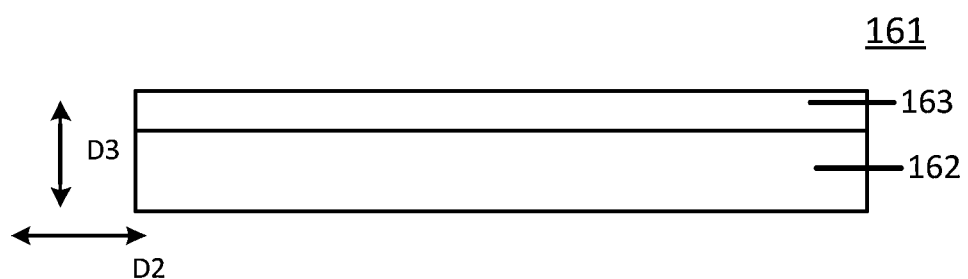
FIG. 11 is a cross-sectional view of a first conductive layer provided by at least one embodiment of the present disclosure.

FIG. 10 illustrates a cross-sectional view of a second conductive layer 151 provided by at least one embodiment of the present disclosure. FIG. 11 illustrates a cross-sectional view of a first conductive layer 161 provided by at least one embodiment of the present disclosure.

For example, the second electrode layer 150 is formed by the second conductive layer 151, that is, all of the first to third power supply wires 115-135 and the first to third opposite power supply wires 116-136 are formed by the second conductive layer 151.

For example, the first electrode layer 160 may be formed by the first conductive layer 161, that is, all of the first to third bonding pads 113-133, the first to third opposite bonding pads 114-134, the first to third common electrodes 111-131, and the first to third opposite common electrodes 112-132 are formed by the first conductive layer 161.

As illustrated in FIG. 10, the second conductive layer 151 comprises a second metal layer 152, and the second conductive layer 151 further comprises a first auxiliary electrode layer 153 at the side of the second metal layer 152 closer to the first electrode layer 160 and a second auxiliary electrode layer 154 at the side of the second metal layer 152 away from the first electrode layer 160.

As illustrated in FIG. 11, the first conductive layer 161 comprises a first metal layer 162, and the first conductive layer 161 further comprises a first transparent conductive oxide 163 which is stacked with the first metal layer 162, and the first transparent conductive oxide 163 is at the side of the first metal layer 162 away from the second electrode layer 150. For example, the first transparent conductive oxide 163 is used for preventing the first metal layer 162 from being oxidized, so as to improve the performance and robustness of the light emitting drive substrate 100. For example, the first transparent conductive oxide 163 may be made of indium tin oxide (ITO) or indium zinc oxide (IZO).

For example, the second metal layer 152 and the first metal layer 162 are both made of a copper-containing metal (for example, both made of copper), so as to realize the required electrical conductivity while satisfying the cost requirement, and allow the power supply wires (for example, the first to third power supply wires 115-135) and/or the opposite power supply wires (for example, the first to third opposite power supply wires 116-136) to be able to bear a larger driving current, such that the application range of the light emitting drive substrate 100 can be increased. For example, the light emitting drive substrate 100 can be applied in a light emitting substrate with a larger size.

For example, the thickness of the second metal layer 152 may be larger than the thickness of the first metal layer 162, so as to allow the power supply wires (the first to third power supply wires 115-135) and the opposite power supply wires (the first to third opposite power supply wires 116-136) to be able to bear larger driving current as compared to the common electrodes (the first to third common electrodes 111-131) and the opposite common electrodes (the first to third opposite common electrodes 112-132) while the temperature increase of the power supply wire and the opposite power supply wire is not obviously larger than the temperature increase of the common electrode and the opposite common electrode.

For example, the first auxiliary electrode layer 153 and the second auxiliary electrode layer 154 are both formed of a molybdenum-niobium alloy (MoNb). For example, the first auxiliary electrode layer 153 and the second auxiliary electrode layer 154 are used for increasing the adhesion between the second metal layer 152 (copper-containing metal layer), and preventing the second metal layer 152 (copper-containing metal) from being oxidized, so as to improve the performance and robustness of the light emitting drive substrate 100.

For example, the material for forming the stress buffer layer 142 comprises a material for generating compressive stress, and the stress buffer layer 142 is used for balancing the tensile stress generated by the second metal layer 152 (copper-containing metal layer). For example, the material for forming the stress buffer layer 142 may comprise silicon nitride (SiNx). For example, the stress buffer layer 142 may be made of silicon nitride (SiNx). For example, in the case where the thickness of the copper layer is about 10000 Å, and the stress buffer layer 142 may adopt silicon nitride (SiNx) with the thickness of about 2500 Å. For example, the stress produced by the copper layer with the thickness of about 10000 Å is about 250 Mpa, and the stress produced by the stress buffer layer 142 is about −200 Mpa, and the overall remaining stress is only 50 Mpa after the stress of the stress buffer layer 142 cancels out at least part of the stress of the copper layer.

Figure 12:
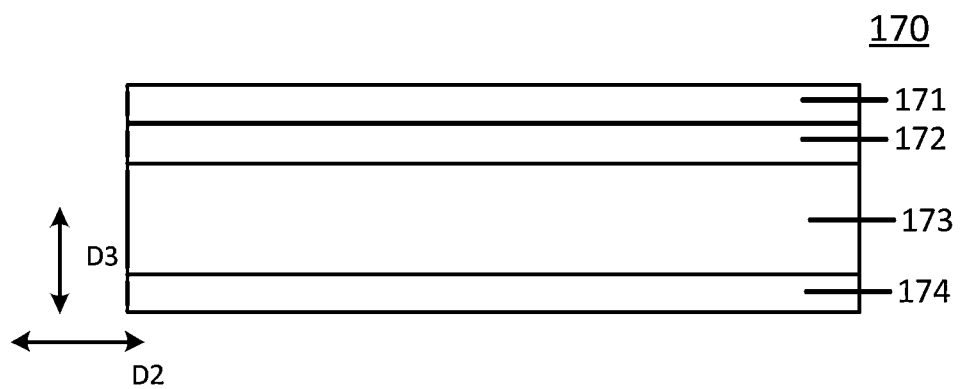
FIG. 12 is a cross-sectional view of a reflective layer provided by at least one embodiment of the present disclosure.

FIG. 12 illustrates a cross-sectional view of the reflective layer 170 provided by at least one embodiment of the present disclosure. As illustrated in FIG. 12, the reflective layer 170 may comprise a third insulation layer 171, a second transparent conductive oxide layer 172, a third metal layer 173 and a third transparent conductive oxide layer 174 which are sequentially provided along the third direction D3, and the third transparent conductive oxide layer 174 is closer to the first electrode layer 160 as compared to the third insulation layer 171. For example, the light emitting drive substrate 100 comprises a light-emitting side (for example, the upper side in FIG. 7), the reflective layer 170 may be used for reflecting the light which is originating the first light emitting element 118 and propagating toward the direction away from the light-emitting side, and allows the reflected light to be propagated toward the light-emitting side, such that light extraction efficiency of the light emitting substrate including the light emitting drive substrate 100 can be increased.

For example, the third metal layer 173 may be made of a silver (Ag) containing metal layer (for example, Ag metal layer). For example, the second transparent conductive oxide layer 172 and the third transparent conductive oxide layer 174 may be used for preventing the third metal layer 173 from being oxidized. For example, it can prevent the third metal layer 173 from being oxidized during the welding process of the first end of the first light emitting element 118 and the bonding pad and the welding process of the second end and the opposite bonding pad, such that the performance and robustness of the light emitting drive substrate 100 can be increased. For example, the second transparent conductive oxide layer 172 and the third transparent conductive oxide layer 174 may be made of indium tin oxide (ITO) or indium zinc oxide (IZO).

The inventors of the present disclosure have further noted during research that, the third insulation layer 171 at the side of the third metal layer 173 away from the second metal layer 152 can increase the reflectivity of the reflective layer 170, and the light extraction efficiency of the light emitting substrate including the light emitting drive substrate 100. For example, the third insulation layer 171 may be made of silicon nitride (SiNx).

For example, according to actual implementation demands, in the case where the first insulation layer 143 is made of resin, the light emitting drive substrate 100 may further comprise a protective layer (not shown in figures), and the protective layer is between the second electrode layer 150 and the first insulation layer 143. The above protective layer is used for preventing the power supply wire and the opposite power supply wire from being contaminated by the resin. For example, the protective layer may be made of silicon nitride (SiNx).

In some examples, the light emitting drive substrate 100 may further comprise the base substrate 141, the second electrode layer 150, the first insulation layer 143, the first electrode layer 160, the second insulation layer 144 and the reflective layer 170 which are sequentially provided along the third direction D3, and the second electrode layer 150 and the first electrode layer 160 are respectively only comprises the cooper metal layer, and no other layers are provided between adjacent film layers, such that adjacent film layers are in direct contact with each other. For example, two sides of the second electrode layer 150 in the third direction D3 are respectively in direct contact with the base substrate 141 and the first insulation layer 143.

Figure 13:
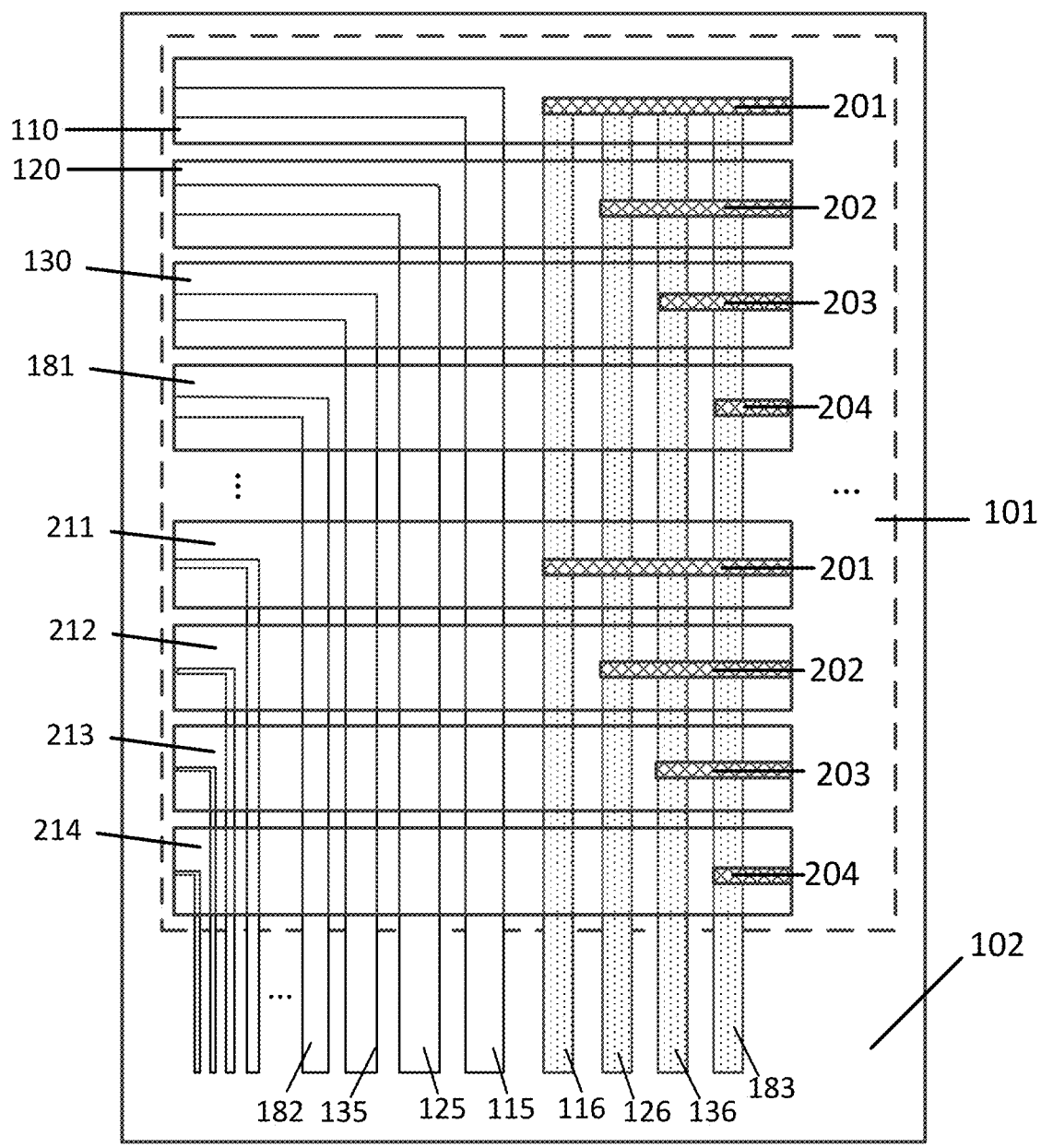
FIG. 13 is a schematic plan view of another light emitting drive substrate provided by at least one embodiment of the present disclosure.

FIG. 13 illustrates another light emitting drive substrate provided by some embodiment of the present disclosure, and the light emitting drive substrate as illustrated in FIG. 13 is similar with the light emitting drive substrate as illustrated in FIG. 3, only the difference of the above two light emitting drive substrates will be described here, and no further description will be given for the repeated content.

As illustrated in FIG. 3 and FIG. 13, the difference of the light emitting drive substrate as illustrated in FIG. 13 and the light emitting drive substrate as illustrated in FIG. 3 comprises the following three point.

Firstly, the illustrative light emitting drive substrate as illustrated in FIG. 13 only comprises four opposite power supply wires, that is, the first opposite power supply wire 116 connected with the first light-emitting subregion 110 to the (4N+1)th subregion 211, the second opposite power supply wire 126 connected with the second light-emitting subregion 120 to the (4N+2)th subregion 212, the third opposite power supply wire 136 connected with the third light-emitting subregion 130 to the (4N+3)th subregion 213, and the fourth opposite power supply wire 182 connected with the fourth light-emitting subregion to the (4N+4)th subregion 214; here, N is a positive integer.

Secondly, the light emitting drive substrate further comprises a first power supply connection wire 201, a second power supply connection wire 202, a third power supply connection wire 203 and the fourth power supply wire 204, the first light-emitting subregion 110 and the (4N+1)th subregion 211 are connected with the first opposite power supply wire 116 via the first power supply connection wire 201; the second light-emitting subregion 120 and the (4N+2)th subregion 212 are connected with the second opposite power supply wire 126 via the second power supply connection wire 202; the third light-emitting subregion 130 and the (4N+3)th subregion 213 are connected with the third opposite power supply wire 136 via the third power supply connection wire 203; the fourth light-emitting subregion and the (4N+1)th subregion 214 are connected with the fourth opposite power supply wire 183 via the fourth power supply wire 204.

Further, the first power supply connection wire 201, the second power supply connection wire 202, the third power supply connection wire 203 and the fourth power supply wire 204 have the same width.

For example, through providing the first power supply connection wire 201, the second power supply connection wire 202, the third power supply connection wire 203 and the fourth power supply wire 204, the first opposite power supply wire 116, the second opposite power supply wire 126, the third opposite power supply wire 136 and the fourth opposite power supply wire 183 respectively can be connected with N subregions; in this case, the number of the opposite power supply wires can be reduced, and more power supply wires and more subregions can be provided on the light emitting drive substrate 100, and therefore, the number of the light emitting elements driven by each subregion and the size of the subregions can be decreased, and the display quality of the display device including the light emitting drive substrate 100 can be increased.

It should be understood that, the light emitting drive substrate as illustrated in FIG. 13 is not limited to the case where four opposite power supply wires are provided, and each opposite power supply wire is not limited to be connected with N subregions, according to actual implementation demands, the light emitting drive substrate may also be provided with opposite power supply wires with other numbers (for example, 5 or 3), and the numbers of the subregions connected with different opposite power supply wires can be the same or different.

It should be understood that, in the case where the second voltage received by the opposite power supply wire is relatively low (for example, zero volt), as illustrated in FIG. 3, the opposite power supply wire of the light emitting drive substrate may also adopt the design of equal wire width.

At least one embodiment of the present disclosure further provides a light emitting substrate, which comprises a light emitting drive substrate provided by any one of the embodiments of the present disclosure, a plurality of first light emitting elements in the first light-emitting subregion, and a plurality of second light emitting elements in the second light-emitting subregion. The light emitting substrate may be implemented as the backlight module or the display panel of a display device, and the backlight module may be applied in for example liquid crystal display devices.

Figure 14:
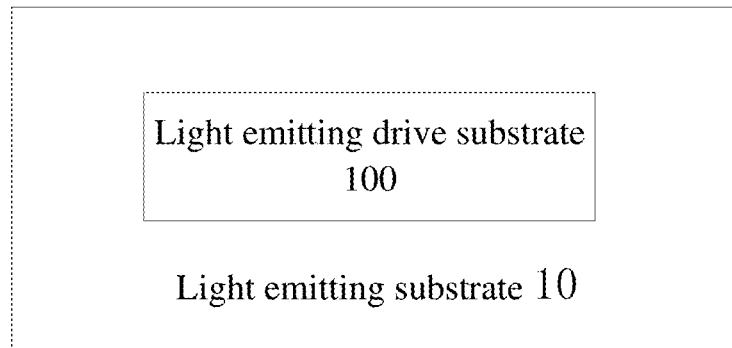
FIG. 14 is a schematic block diagram of a light emitting substrate provided by at least one embodiment of the present disclosure.

FIG. 14 illustrates a light emitting substrate provided by at least one embodiment of the present disclosure. As illustrated in FIG. 14, the light emitting substrate comprises a light emitting drive substrate 100 provided by any one of the embodiments of the present disclosure. For example, the light emitting substrate further comprises a plurality of light emitting elements in a plurality of subregions. As illustrated in FIG. 5A, the light emitting substrate further comprises a plurality of first light emitting elements in the first light-emitting subregion and a plurality of second light emitting elements in the second light-emitting subregion. The first electrodes of the first light emitting elements are connected with first electrical contact sections, the second electrodes of the first light emitting elements are connected with first opposite electrical contact sections; the first electrode of the second light emitting elements are connected with second electrical contact sections, the second electrodes of the second light emitting elements are connected with second opposite electrical contact sections.

Figure 15:
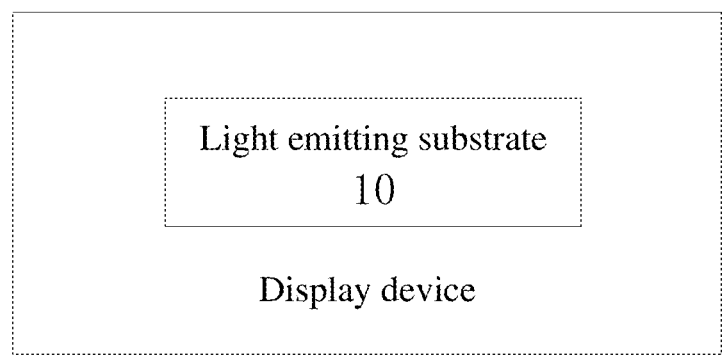
FIG. 15 is a schematic block diagram of a display device provided by at least one embodiment of the present disclosure.

At least one embodiment of the present disclosure further provides a display device, as illustrated in FIG. 15, the display device comprises a light emitting substrate 10 provided by any one of the embodiments of the present disclosure.

For example, in some embodiments, the display device is a liquid crystal display device, which comprises a liquid crystal display panel and a backlight module at a non-display side of the liquid crystal display panel, the liquid crystal display panel comprises an array substrate and an opposite substrate which are opposite to each other to form a liquid crystal cell, and a liquid crystal material is filled in the liquid crystal cell. The opposite substrate for example is a color filter substrate. The backlight module comprises the above light emitting substrate; for example, the backlight module may be used for realizing high-dynamic range (HDR) dimming so as to be used in display operation. The liquid display device can have more uniform backlight brightness, and have a better display contrast ratio.

In some other embodiments, the display device is an LED display device, which comprises the above light emitting substrate, each pixel unit comprises a plurality of sub-pixels, and each sub-pixel, for example, comprises one light emitting element, which may be, for example, used for emitting red light (R), green light (G), and blue light (B).

At least one embodiment of the present disclosure further provides a manufacturing method of a light emitting drive substrate, the light emitting drive substrate comprises a periphery area, and the method comprises: forming a first light-emitting subregion, a second light-emitting subregion, a first power supply wire and a second power supply wire. The first light-emitting subregion comprises a first common electrode, and the second light-emitting subregion comprises a second common electrode; the first power supply wire comprises a first end which is electrically connected with the first common electrode and a second end which is extended to the periphery area and is configured for electrically connection so as to receive a first power supply voltage; the second power supply wire comprises a first end which is electrically connected with the second common electrode and a second end which is extended to the periphery area and is configured for electrically connection so as to receive the first power supply voltage; and a resistance between the first end of the first power supply wire and the second end of the first power supply wire is equal to a resistance between the first end of the second power supply wire and the second end of the second power supply wire; and a wire length between the first end of the first power supply wire and the second end of the first power supply wire is not equal to a wire length between the first end of the second power supply wire and the second end of the second power supply wire.

For example, the specific implementation of the first light-emitting subregion, the second light-emitting subregion, the first power supply wire and the second power supply wire may refer to the light emitting drive substrate, and no further description will be given here.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. A light emitting drive substrate, comprising a first light-emitting subregion, a second light-emitting subregion, a periphery area, a first power supply wire and a second power supply wire, a first opposite power supply wire and a second opposite power supply wire, a base substrate, a first insulation layer, a first electrode layer and a second electrode layer, wherein the first light-emitting subregion comprises a first common electrode, and the second light-emitting subregion comprises a second common electrode;

the first power supply wire comprises a first end which is electrically connected with the first common electrode and a second end which is extended to the periphery area and is configured for electrically connection so as to receive a first power supply voltage;

the second power supply wire comprises a first end which is electrically connected with the second common electrode and a second end which is extended to the periphery area and is configured for electrically connection so as to receive the first power supply voltage;

a resistance between the first end of the first power supply wire and the second end of the first power supply wire is equal to a resistance between the first end of the second power supply wire and the second end of the second power supply wire; and a wire length between the first end of the first power supply wire and the second end of the first power supply wire is not equal to a wire length between the first end of the second power supply wire and the second end of the second power supply wire, wherein the first light-emitting subregion further comprises a first opposite common electrode, the second light-emitting subregion further comprises a second opposite common electrode;

the first opposite power supply wire comprises a first end which is electrically connected with the first opposite common electrode, and a second end which is extended to the periphery area and is configured for electrically connection so as to receive a second power supply voltage;

the second opposite power supply wire comprises a first end which is electrically connected with the second opposite common electrode and a second end which is extended to the periphery area and is configured for electrically connection so as to receive the second power supply voltage;

a resistance between the first end of the first opposite power supply wire and the second end of the first opposite power supply wire is equal to a resistance between the first end of the second opposite power supply wire and the second end of the second opposite power supply wire;

a wire length between the first end of the first opposite power supply wire and the second end of the first opposite power supply wire is not equal to a wire length between the first end of the second opposite power supply wire and the second end of the second opposite power supply wire; and the second power supply voltage is smaller than the first power supply voltage, wherein the first electrode layer is at a side of the second electrode layer away from the base substrate;

the first electrode layer comprises the first common electrode, the second common electrode, the first opposite common electrode and the second opposite common electrode;

the second electrode layer comprises the first power supply wire, the second power supply wire, the first opposite power supply wire and the second opposite power supply wire;

the first insulation layer is between the first electrode layer and the second electrode layer, and comprises a first through hole, a second through hole, a third through hole and a fourth through hole; and the first power supply wire is electrically connected with the first common electrode via the first through hole, the second power supply wire is electrically connected with the second common electrode via the second through hole, the first opposite power supply wire is electrically connected with the first opposite common electrode via the third through hole, and the second opposite power supply wire is electrically connected with the second opposite common electrode via the fourth through hole.

2. The light emitting drive substrate according to claim 1, wherein a ratio of the wire length between the first end of the first power supply wire and the second end of the first power supply wire to the wire length between the first end of the second power supply wire and the second end of the second power supply wire, is equal to a ratio of a wire width of the first power supply wire to a wire width of the second power supply wire.

3. The light emitting drive substrate according to claim 1, further comprising a third light-emitting subregion and a third power supply wire, wherein the third light-emitting subregion comprises a third common electrode;

the third power supply wire comprises a first end which is electrically connected with the third common electrode and a second end which is extended to the periphery area and is configured for electrically connection so as to receive the first power supply voltage;

a resistance between the first end of the third power supply wire and the second end of the third power supply wire is equal to the resistance between the first end of the first power supply wire and the second end of the first power supply wire; and the wire length between the first end of the first power supply wire and the second end of the first power supply wire, the wire length between the first end of the second power supply wire and the second end of the second power supply wire, and a wire length between the first end of the third power supply wire and the second end of the third power supply wire are different from each other.

4. The light emitting drive substrate according to claim 3, wherein the wire width of the first power supply wire, the wire width of the second power supply wire, and a wire width of the third power supply wire decrease gradually.

5. The light emitting drive substrate according to claim 4, wherein the wire width of the first power supply wire, the wire width of the second power supply wire, and the wire width of the third power supply wire decrease according to an arithmetic progression.

6. The light emitting drive substrate according to claim 1, wherein the first light-emitting subregion comprises a plurality of first electrical contact sections and a plurality of first opposite electrical contact sections;

at least part of the plurality of first electrical contact sections is connected with the first common electrode;

at least part of the plurality of first opposite electrical contact sections is connected with the first opposite common electrode;

the second light-emitting subregion comprises a plurality of second electrical contact sections and a plurality of second opposite electrical contact sections;

at least part of the plurality of second electrical contact sections is connected with the second common electrode; and at least part of the plurality of second opposite electrical contact sections is connected with the second opposite common electrode.

7. The light emitting drive substrate according to claim 6, wherein the plurality of first electrical contact sections, the plurality of first opposite electrical contact sections, the plurality of second electrical contact sections, the plurality of second opposite electrical contact sections, the first common electrode, the first opposite common electrode, the second common electrode and the second opposite common electrode are in same one layer.

8. The light emitting drive substrate according to claim 6, wherein the first light-emitting subregion and the second light-emitting subregion are arranged in parallel in a first direction; and the first power supply wire, the second power supply wire, the first opposite power supply wire and the second opposite power supply wire are arranged in parallel in a second direction which intersects the first direction.

9. The light emitting drive substrate according to claim 1, wherein the first light-emitting subregion comprises one first electrical contact section and one first opposite electrical contact section;

the one first electrical contact section is connected with the first common electrode, and the one first opposite electrical contact section is connected with the first opposite common electrode; and the second light-emitting subregion comprises one second electrical contact section and one second opposite electrical contact section, the one second electrical contact section is connected with the second common electrode, and the one second opposite electrical contact section is connected with the second opposite common electrode.

10. The light emitting drive substrate according to claim 1, wherein the first electrode layer is formed by a first conductive layer, and the first conductive layer comprises a first metal layer; and the first conductive layer further comprises a first transparent conductive oxide which is stacked with the first metal layer, and the first transparent conductive oxide is at a side of the first metal layer away from the second electrode layer.

11. The light emitting drive substrate according to claim 1, wherein the second electrode layer is formed by a second conductive layer;

the second conductive layer comprises a second metal layer; and a thickness of the second metal layer is larger than a thickness of the first metal layer.

12. The light emitting drive substrate according to claim 11, wherein the second conductive layer further comprises:

a first auxiliary electrode layer which is at a side of the second metal layer closer to the first electrode layer, and a second auxiliary electrode layer which is at a side of the second metal layer away from the first electrode layer.

13. The light emitting drive substrate according to claim 12, wherein both of the second metal layer and the first metal layer are formed of a copper-containing metal; and both of the first auxiliary electrode layer and the second auxiliary electrode layer are formed of a molybdenum-niobium alloy.

14. The light emitting drive substrate according to claim 1, further comprising a reflective layer and a second insulation layer, wherein the reflective layer is at a side of the first electrode layer away from the second electrode layer;
the second insulation layer is between the first electrode layer and the reflective layer;
the reflective layer comprises a third insulation layer, a second transparent conductive oxide layer, a third metal layer, and a third transparent conductive oxide layer which are sequentially provided; and as compared to the third insulation layer, the third transparent conductive oxide layer is closer to the first electrode layer.

15. The light emitting drive substrate according to claim 8, further comprising a stress buffer layer and a protective layer, wherein the stress buffer layer is between the base substrate and the second electrode layer; and the protective layer is between the second electrode layer and the first insulation layer.

16. A light emitting substrate, comprising:

a light emitting drive substrate, comprising a first light-emitting subregion, a second light-emitting subregion, a periphery area, a first power supply wire and a second power supply wire, a first opposite power supply wire and a second opposite power supply wire, a base substrate, a first insulation layer, a first electrode layer and a second electrode layer, wherein the first light-emitting subregion comprises a first common electrode, and the second light-emitting subregion comprises a second common electrode, the first power supply wire comprises a first end which is electrically connected with the first common electrode and a second end which is extended to the periphery area and is configured for electrically connection so as to receive a first power supply voltage, the second power supply wire comprises a first end which is electrically connected with the second common electrode and a second end which is extended to the periphery area and is configured for electrically connection so as to receive the first power supply voltage, a resistance between the first end of the first power supply wire and the second end of the first power supply wire is equal to a resistance between the first end of the second power supply wire and the second end of the second power supply wire, and a wire length between the first end of the first power supply wire and the second end of the first power supply wire is not equal to a wire length between the first end of the second power supply wire and the second end of the second power supply wire; at least one first light emitting element which is in the first light-emitting subregion, and at least one second light emitting element which is in the second light-emitting subregion, wherein the at least one first light emitting element is configured to receive a first power supply voltage on the first power supply wire so as to emit light, and the at least one second light emitting element is configured to receive the first power supply voltage on the second power supply wire so as to emit light, wherein the first light-emitting subregion further comprises a first opposite common electrode, the second light-emitting subregion further comprises a second opposite common electrode;

the first opposite power supply wire comprises a first end which is electrically connected with the first opposite common electrode, and a second end which is extended to the periphery area and is configured for electrically connection so as to receive a second power supply voltage;

the second opposite power supply wire comprises a first end which is electrically connected with the second opposite common electrode and a second end which is extended to the periphery area and is configured for electrically connection so as to receive the second power supply voltage;

a resistance between the first end of the first opposite power supply wire and the second end of the first opposite power supply wire is equal to a resistance between the first end of the second opposite power supply wire and the second end of the second opposite power supply wire;

a wire length between the first end of the first opposite power supply wire and the second end of the first opposite power supply wire is not equal to a wire length between the first end of the second opposite power supply wire and the second end of the second opposite power supply wire; and the second power supply voltage is smaller than the first power supply voltage, wherein the first electrode layer is at a side of the second electrode layer away from the base substrate;

the first electrode layer comprises the first common electrode, the second common electrode, the first opposite common electrode and the second opposite common electrode;

the second electrode layer comprises the first power supply wire, the second power supply wire, the first opposite power supply wire and the second opposite power supply wire;

the first insulation layer is between the first electrode layer and the second electrode layer, and comprises a first through hole, a second through hole, a third through hole and a fourth through hole; and the first power supply wire is electrically connected with the first common electrode via the first through hole, the second power supply wire is electrically connected with the second common electrode via the second through hole, the first opposite power supply wire is electrically connected with the first opposite common electrode via the third through hole, and the second opposite power supply wire is electrically connected with the second opposite common electrode via the fourth through hole.

17. A display device, comprising the light emitting substrate according to claim 16.

18. A manufacturing method of a light emitting drive substrate, wherein the light emitting drive substrate comprises a periphery area, and the method comprises:

forming a first light-emitting subregion, a second light-emitting subregion, a first power supply wire, and a second power supply wire, a first opposite power supply wire and a second opposite power supply wire, a base substrate, a first insulation layer, a first electrode layer and a second electrode layer, wherein the first light-emitting subregion comprises a first common electrode, and the second light-emitting subregion comprises a second common electrode;

the first power supply wire comprises a first end which is electrically connected with the first common electrode and a second end which is extended to the periphery area and is configured for electrically connection so as to receive a first power supply voltage;

the second power supply wire comprises a first end which is electrically connected with the second common electrode and a second end which is extended to the periphery area and is configured for electrically connection so as to receive the first power supply voltage;

a resistance between the first end of the first power supply wire and the second end of the first power supply wire is equal to a resistance between the first end of the second power supply wire and the second end of the second power supply wire; and a wire length between the first end of the first power supply wire and the second end of the first power supply wire is not equal to a wire length between the first end of the second power supply wire and the second end of the second power supply wire, wherein the first light-emitting subregion further comprises a first opposite common electrode, the second light-emitting subregion further comprises a second opposite common electrode;

the first opposite power supply wire comprises a first end which is electrically connected with the first opposite common electrode, and a second end which is extended to the periphery area and is configured for electrically connection so as to receive a second power supply voltage;

the second opposite power supply wire comprises a first end which is electrically connected with the second opposite common electrode and a second end which is extended to the periphery area and is configured for electrically connection so as to receive the second power supply voltage;

a resistance between the first end of the first opposite power supply wire and the second end of the first opposite power supply wire is equal to a resistance between the first end of the second opposite power supply wire and the second end of the second opposite power supply wire;

a wire length between the first end of the first opposite power supply wire and the second end of the first opposite power supply wire is not equal to a wire length between the first end of the second opposite power supply wire and the second end of the second opposite power supply wire; and the second power supply voltage is smaller than the first power supply voltage, wherein the first electrode layer is at a side of the second electrode layer away from the base substrate;

the first electrode layer comprises the first common electrode, the second common electrode, the first opposite common electrode and the second opposite common electrode;

the second electrode layer comprises the first power supply wire, the second power supply wire, the first opposite power supply wire and the second opposite power supply wire;

the first insulation layer is between the first electrode layer and the second electrode layer, and comprises a first through hole, a second through hole, a third through hole and a fourth through hole; and the first power supply wire is electrically connected with the first common electrode via the first through hole, the second power supply wire is electrically connected with the second common electrode via the second through hole, the first opposite power supply wire is electrically connected with the first opposite common electrode via the third through hole, and the second opposite power supply wire is electrically connected with the second opposite common electrode via the fourth through hole.

\* \* \* \* \*